(12) United States Patent
Valeri et al.

(10) Patent No.: US 10,818,363 B1
(45) Date of Patent: Oct. 27, 2020

(54) APPARATUS AND METHODS FOR CALIBRATING SENSING OF MEMORY CELL DATA STATES

(71) Applicant: MICRON TECHNOLOGY, INC., Boise, ID (US)

(72) Inventors: Gianfranco Valeri, Pescina (IT); Violante Moschiano, Avezzano (IT); Walter Di-Francesco, Silvi (IT)

(73) Assignee: Micron Technolgy, Inc., Boise, ID (US)

(*) Notice: Subject to any disclaimer, the term of this patent is extended or adjusted under 35 U.S.C. 154(b) by 0 days.

(21) Appl. No.: 16/414,897

(22) Filed: May 17, 2019

(51) Int. Cl.
*G11C 13/00* (2006.01)
*G11C 16/28* (2006.01)
*G06F 11/10* (2006.01)
*G11C 16/10* (2006.01)

(52) U.S. Cl.
CPC .......... *G11C 16/28* (2013.01); *G06F 11/1008* (2013.01); *G11C 13/004* (2013.01); *G11C 16/107* (2013.01)

(58) Field of Classification Search
CPC ..... G11C 16/28; G11C 16/107; G11C 13/004; G06F 11/1008
See application file for complete search history.

(56) References Cited

U.S. PATENT DOCUMENTS

| | | | |
|---|---|---|---|
| 6,845,052 B1* | 1/2005 | Ho | G11C 7/062 365/148 |
| 8,391,061 B2* | 3/2013 | Elmhurst | G11C 16/0483 365/185.03 |
| 8,934,306 B2 | 1/2015 | Shen et al. | |
| 9,047,972 B2 | 6/2015 | Helm et al. | |
| 10,062,441 B1 | 8/2018 | Vali et al. | |
| 10,535,397 B1* | 1/2020 | Kawamura | G11C 11/5657 |
| 2005/0024944 A1* | 2/2005 | Tanaka | G11C 11/5628 365/185.28 |

(Continued)

OTHER PUBLICATIONS

H. Maejima, et al., "A 512Gb 3b/Cell 3D Flash Memory on a 96-Word-Line-Layer Technology," 2018 IEEE International Solid-State Circuits Conference, Session 20, Flash-Memory Solutions, 20.1, Digest of Technical Papers, Feb. 14, 2018, pp. 336-337.

(Continued)

*Primary Examiner* — Khamdan N. Alrobaie
(74) *Attorney, Agent, or Firm* — Dicke, Billig & Czaja, PLLC

(57) ABSTRACT

Methods of operating a memory, and apparatus configured to perform similar methods, include determining first states of a first sense node and a second sense node while a first voltage level is capacitively coupled to the first sense node and while a second voltage level is capacitively coupled to the second sense node, determining a second states of the first and second sense nodes while a third voltage level is capacitively coupled to the first sense node and while a fourth voltage level is capacitively coupled to the second sense node, determining a fifth voltage level in response to at least the first states of the first and second sense nodes and the second states of the first and second sense nodes, and determining third states of the first and second sense nodes while the fifth voltage level is capacitively coupled to the first and second sense nodes.

22 Claims, 19 Drawing Sheets

(56) References Cited

U.S. PATENT DOCUMENTS

| | | | |
|---|---|---|---|
| 2007/0002632 A1* | 1/2007 | Okayama | G11C 16/3418 |
| | | | 365/185.24 |
| 2013/0051137 A1* | 2/2013 | Zeng | G11C 13/0061 |
| | | | 365/163 |
| 2013/0265827 A1* | 10/2013 | Moschiano | G11C 11/5628 |
| | | | 365/185.18 |
| 2016/0358664 A1* | 12/2016 | Li | G11C 16/10 |

OTHER PUBLICATIONS

V. Moschiano et al.; "Apparatus and Methods for Determining Data States of Memory Cells," U.S. Appl. No. 16/267,488; filed Feb. 5, 2019; Total pp. 49.

T. Vali et al.; "Apparatus and Methods for Determining Data States of Memory Cells," U.S. Appl. No. 16/152,897; filed Oct. 5, 2018; Total pp. 61.

* cited by examiner

|  $350_0$ | $350_1$ | $350_2$ | $350_3$ |
|---|---|---|---|
| Block$_0$ $250_0$ | Block$_0$ $250_0$ | Block$_0$ $250_0$ | Block$_0$ $250_0$ |
| Block$_1$ $250_1$ | Block$_1$ $250_1$ | Block$_1$ $250_1$ | Block$_1$ $250_1$ |
| Block$_2$ $250_2$ | Block$_2$ $250_2$ | Block$_2$ $250_2$ | Block$_2$ $250_2$ |
| Block$_3$ $250_3$ | Block$_3$ $250_3$ | Block$_3$ $250_3$ | Block$_3$ $250_3$ |
| Block$_4$ $250_4$ | Block$_4$ $250_4$ | Block$_4$ $250_4$ | Block$_4$ $250_4$ |
| ⋮ | ⋮ | ⋮ | ⋮ |
| Block$_{L-4}$ $250_{L-4}$ | Block$_{L-4}$ $250_{L-4}$ | Block$_{L-4}$ $250_{L-4}$ | Block$_{L-4}$ $250_{L-4}$ |
| Block$_{L-3}$ $250_{L-3}$ | Block$_{L-3}$ $250_{L-3}$ | Block$_{L-3}$ $250_{L-3}$ | Block$_{L-3}$ $250_{L-3}$ |
| Block$_{L-2}$ $250_{L-2}$ | Block$_{L-2}$ $250_{L-2}$ | Block$_{L-2}$ $250_{L-2}$ | Block$_{L-2}$ $250_{L-2}$ |
| Block$_{L-1}$ $250_{L-1}$ | Block$_{L-1}$ $250_{L-1}$ | Block$_{L-1}$ $250_{L-1}$ | Block$_{L-1}$ $250_{L-1}$ |
| Block$_L$ $250_L$ | Block$_L$ $250_L$ | Block$_L$ $250_L$ | Block$_L$ $250_L$ |
| $240_0$ | $240_1$ | $240_2$ | $240_3$ |

APPARATUS AND METHODS FOR CALIBRATING SENSING OF MEMORY CELL DATA STATES

TECHNICAL FIELD

The present disclosure relates generally to memory and, in particular, in one or more embodiments, the present disclosure relates to apparatus and methods for calibrating sensing of memory cell data states.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is deemed to be activated in response to a particular voltage applied to its control gate, such as by detecting whether a data line connected to the memory cell experiences a sufficient change in voltage level caused by current flow through the memory cell. As memory operation advances to represent additional data states per memory cell, the margins between adjacent Vt ranges can become smaller. This can lead to an inaccurate determination of the data state of a sensed memory cell if the Vt of the sensed memory cell shifts over time.

Threshold voltages of memory cells may shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region.

Threshold voltages of memory cells may further shift due to cumulative charge loss over the age of their programmed data, e.g., a period of time between programming the data and reading the data. Such charge loss can become more pronounced as the data storage structures become smaller.

Furthermore, threshold voltages of memory cells may shift due to read disturb. In read disturb, the threshold voltage of a memory cell may shift in response to the voltage applied to the memory cell to facilitate access to the target memory cell selected for reading, e.g., increasing the threshold voltage of the memory cell.

BRIEF DESCRIPTION OF THE DRAWINGS

FIG. 3 is a block schematic of a portion of an array of memory cells as could be used in a memory of the type described with reference to FIG. 1.

DETAILED DESCRIPTION

Figure 1:
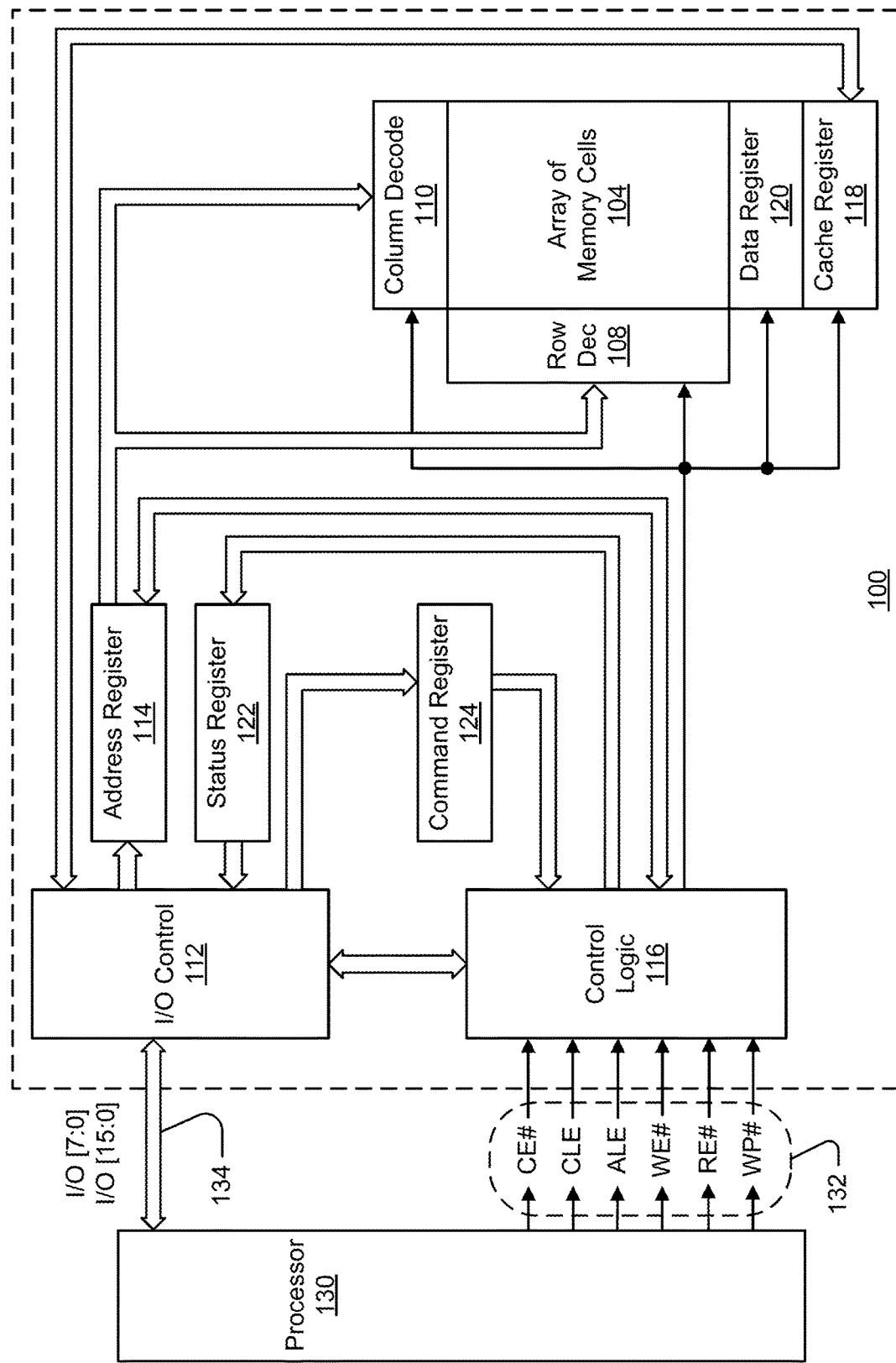
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

As used herein, multiple acts being performed concurrently will mean that each of these acts is performed for a respective time period, and each of these respective time periods overlaps, in part or in whole, with each of the remaining respective time periods. In other words, those acts are concurrently performed for at least some period of time.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. The control logic 116 might be configured to perform methods of operating a memory in accordance with embodiments.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a page buffer of the memory device 100. A page buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
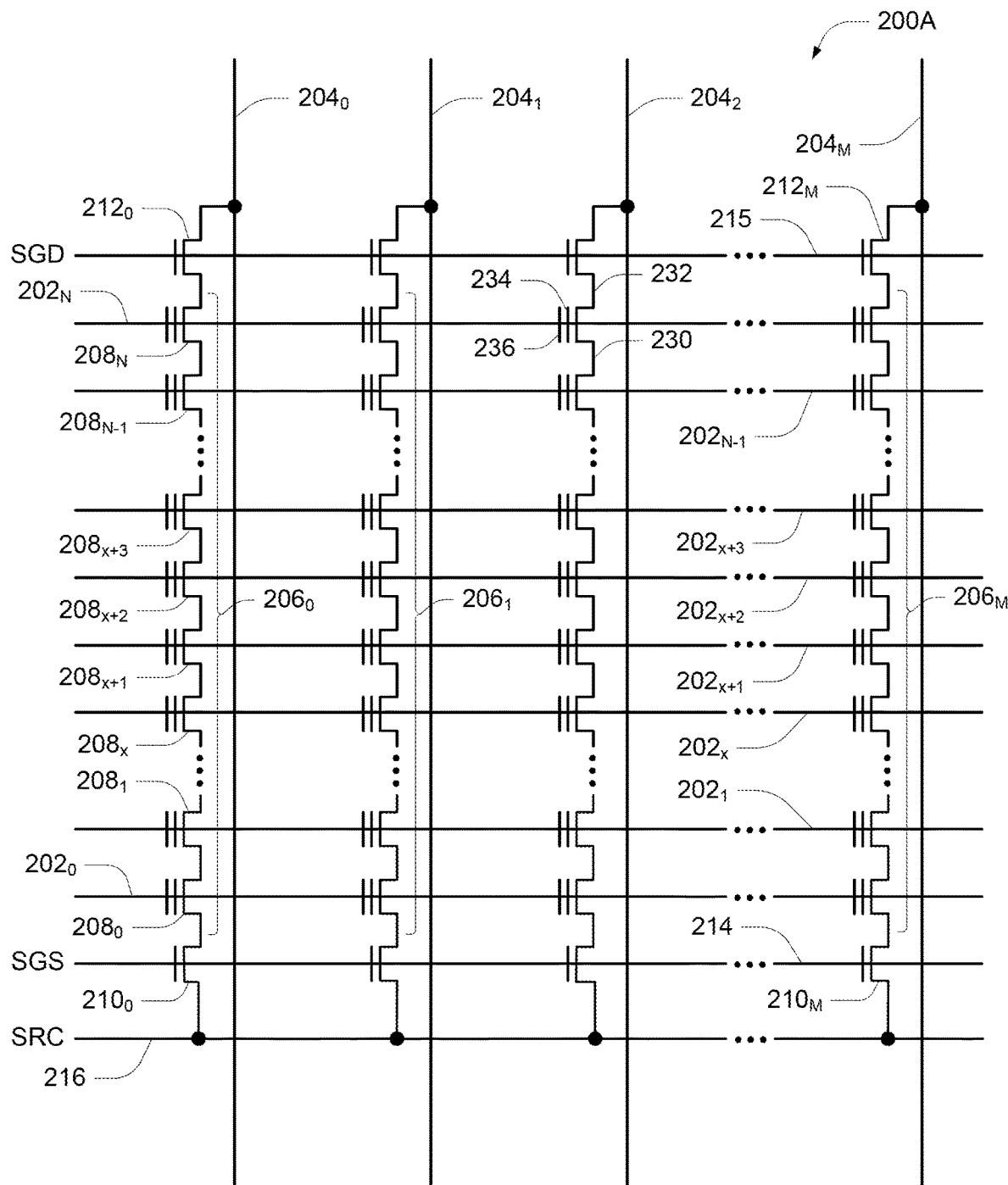
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
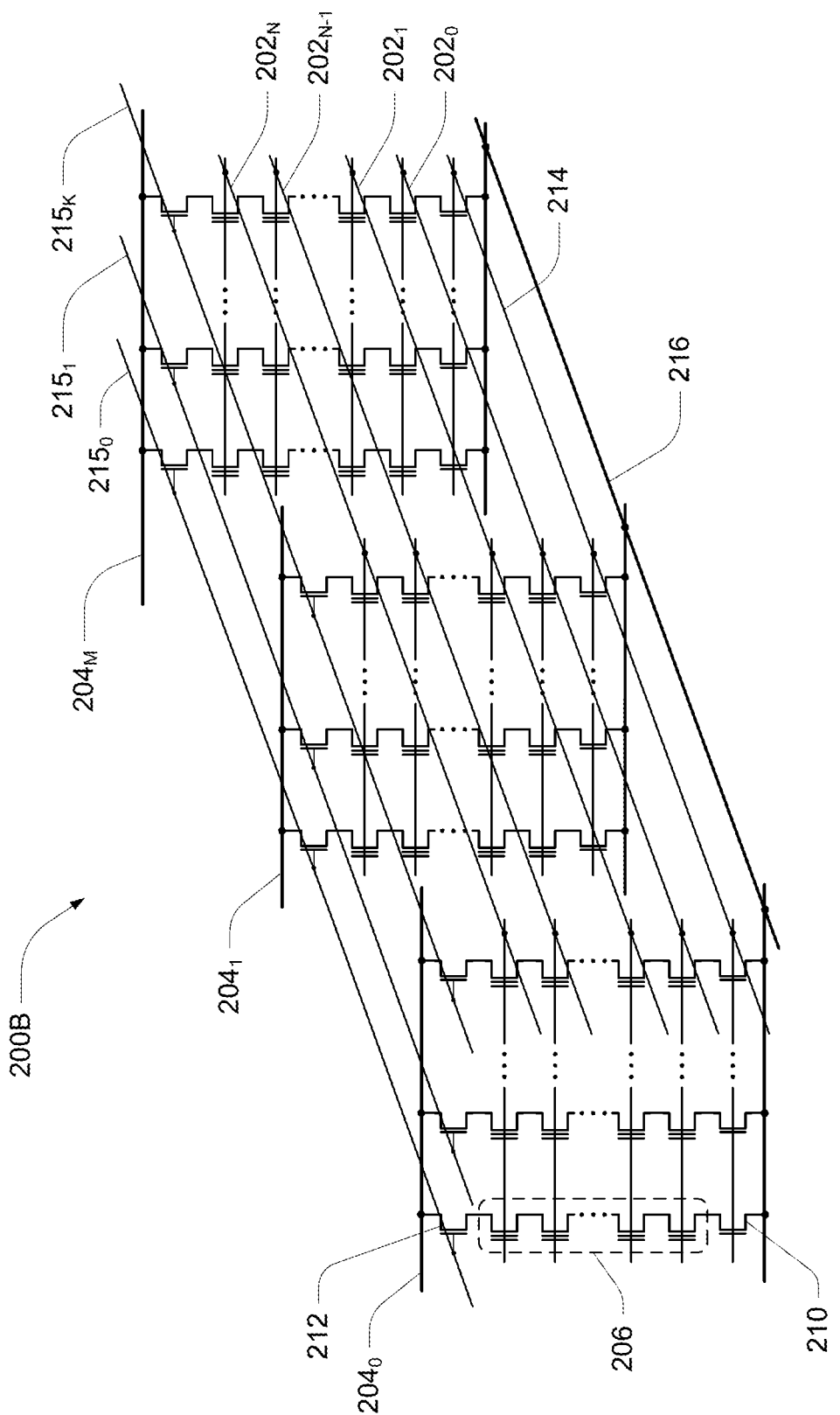

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 2C:
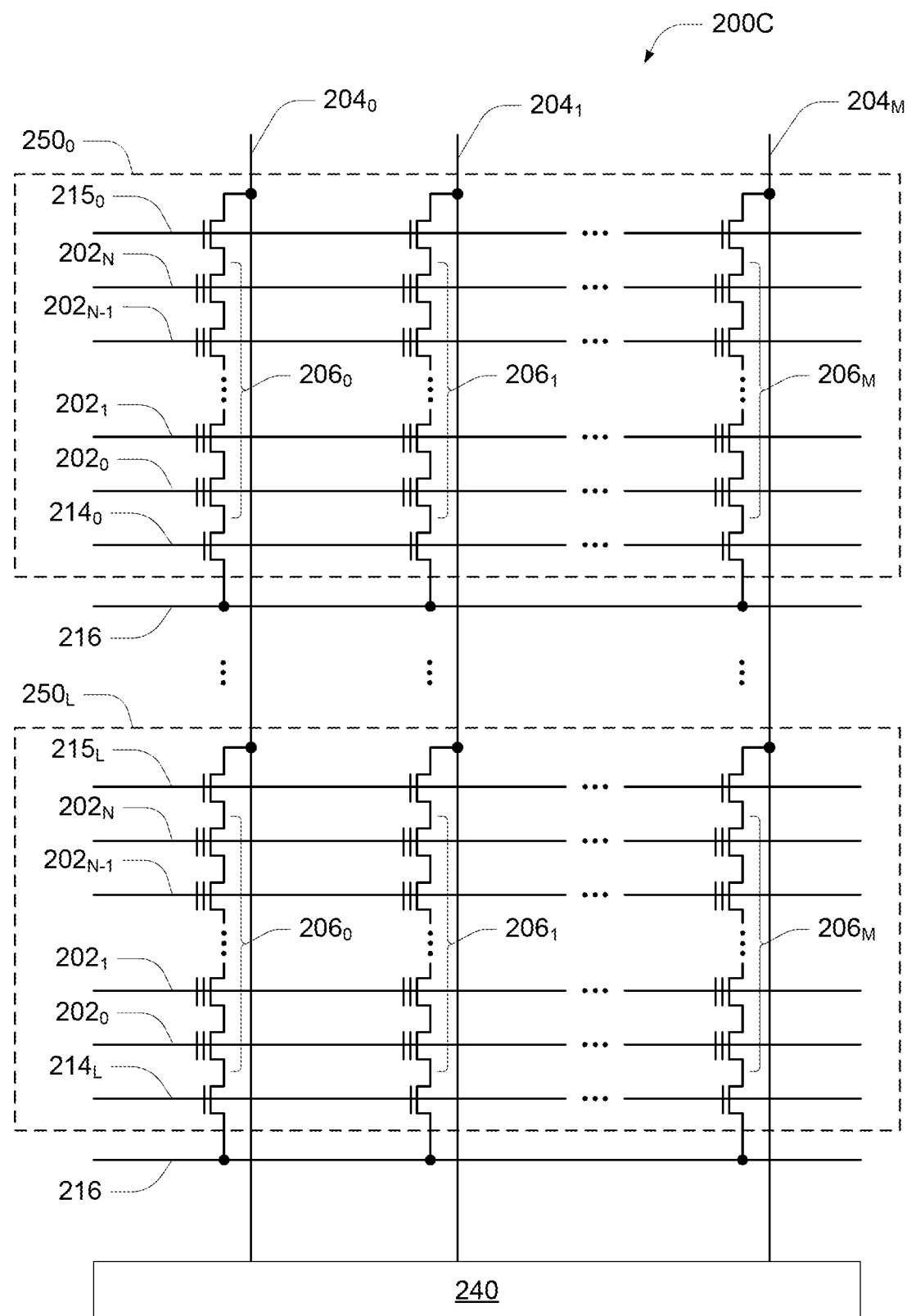

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might represent those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a page buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

FIG. 3 is a block schematic of a portion of an array of memory cells as could be used in a memory of the type described with reference to FIG. 1. The array of memory cells 300 is depicted to have four memory planes 350 (e.g., memory planes $350_0$-$350_3$), each in communication with a respective buffer portion 240, which might collectively form a page buffer 352. While four memory planes 350 are depicted, other numbers of memory planes 350 might be commonly in communication with a page buffer 352. Each memory plane 350 is depicted to include L+1 blocks of memory cells 250 (e.g., blocks of memory cells $250_0$-$250_L$).

Figure 4:
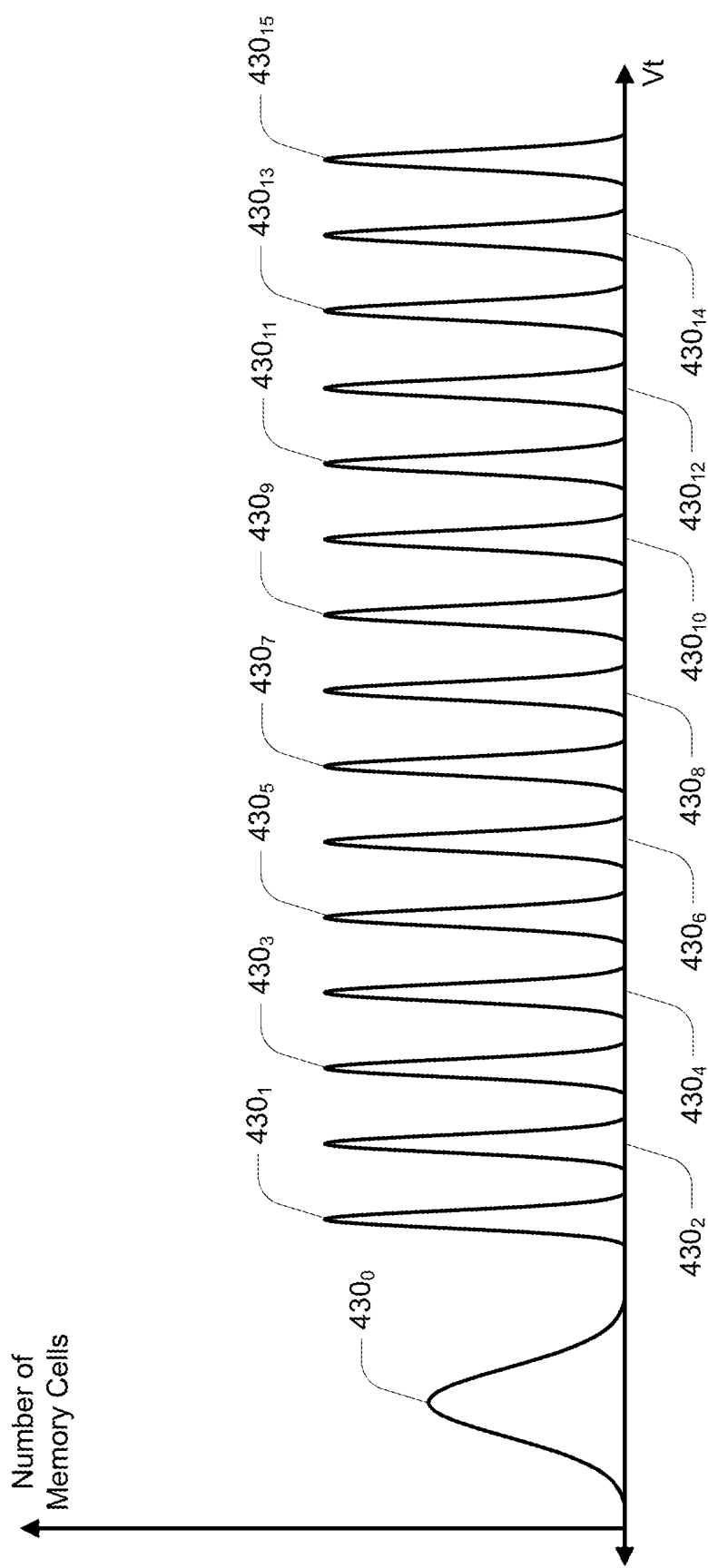
FIG. 4 is a conceptual depiction of threshold voltage distributions of a plurality of memory cells.

FIG. 4 is a conceptual depiction of threshold voltage ranges of a plurality of memory cells. FIG. 4 illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges $430_0$-$430_{15}$, each being used to represent a data state corresponding to a bit pattern of four bits. The threshold voltage range $430_0$ typically has a greater width than the remaining threshold voltage ranges $430_1$-$430_{15}$ as memory cells are generally all placed in the data state corresponding to the threshold voltage range $430_0$, then subsets of those memory cells are subsequently programmed to have threshold voltages in one of the threshold voltage ranges $430_1$-$430_{15}$. As programming operations are generally more incrementally controlled than erase operations, these threshold voltage ranges $430_1$-$430_{15}$ may tend to have tighter distributions.

The threshold voltage ranges $430_0$, $430_1$, $430_2$, $430_3$, $430_4$, $430_5$, $430_6$, $430_7$, $430_8$, $430_9$, $430_{10}$, $430_{11}$, $430_{12}$, $430_{13}$, $430_{14}$ and $430_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $430_0$, the memory cell in this case may be storing a data state L0 having a data value of logical '1111' and is typically referred to as the erased state of the memory cell. If the threshold voltage is within the second of the sixteen threshold voltage ranges $430_1$, the memory cell in this case may be storing a data state L1 having a data value of logical '0111'. If the threshold voltage is within the third of the sixteen threshold voltage ranges $430_2$, the memory cell in this case may be storing a data state L2 having a data value of logical '0011', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state.

TABLE 1

| Data State | Logical Data Value |
|---|---|
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |
| L10 | 0000 |
| L11 | 1000 |
| L12 | 1010 |
| L13 | 0010 |
| L14 | 0110 |
| L15 | 1110 |

Figure 5A:
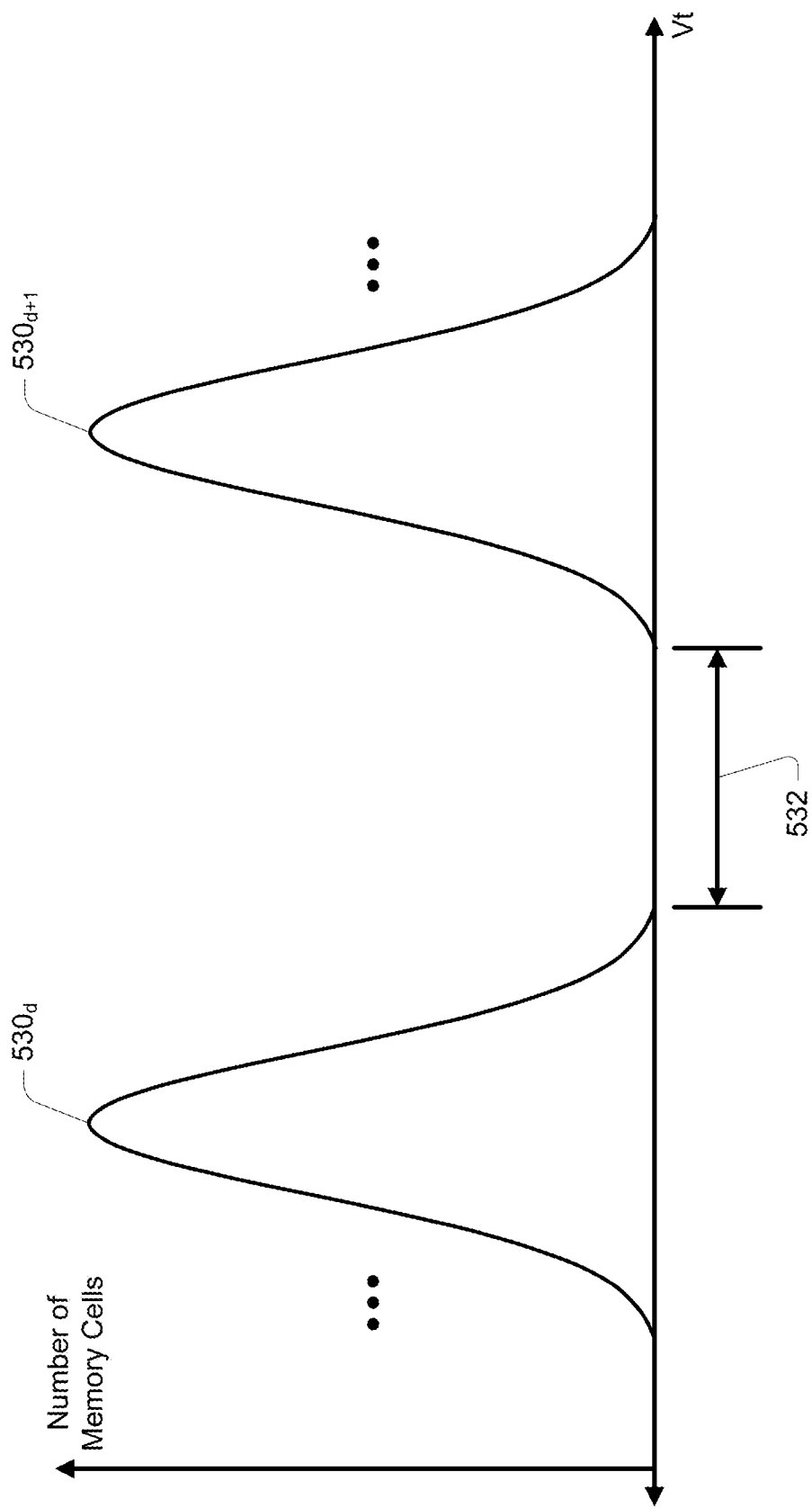
FIGS. 5A-5B are conceptual depictions of threshold voltage distributions of a plurality of memory cells at different stages following programming for use with embodiments.
Figure 5B:
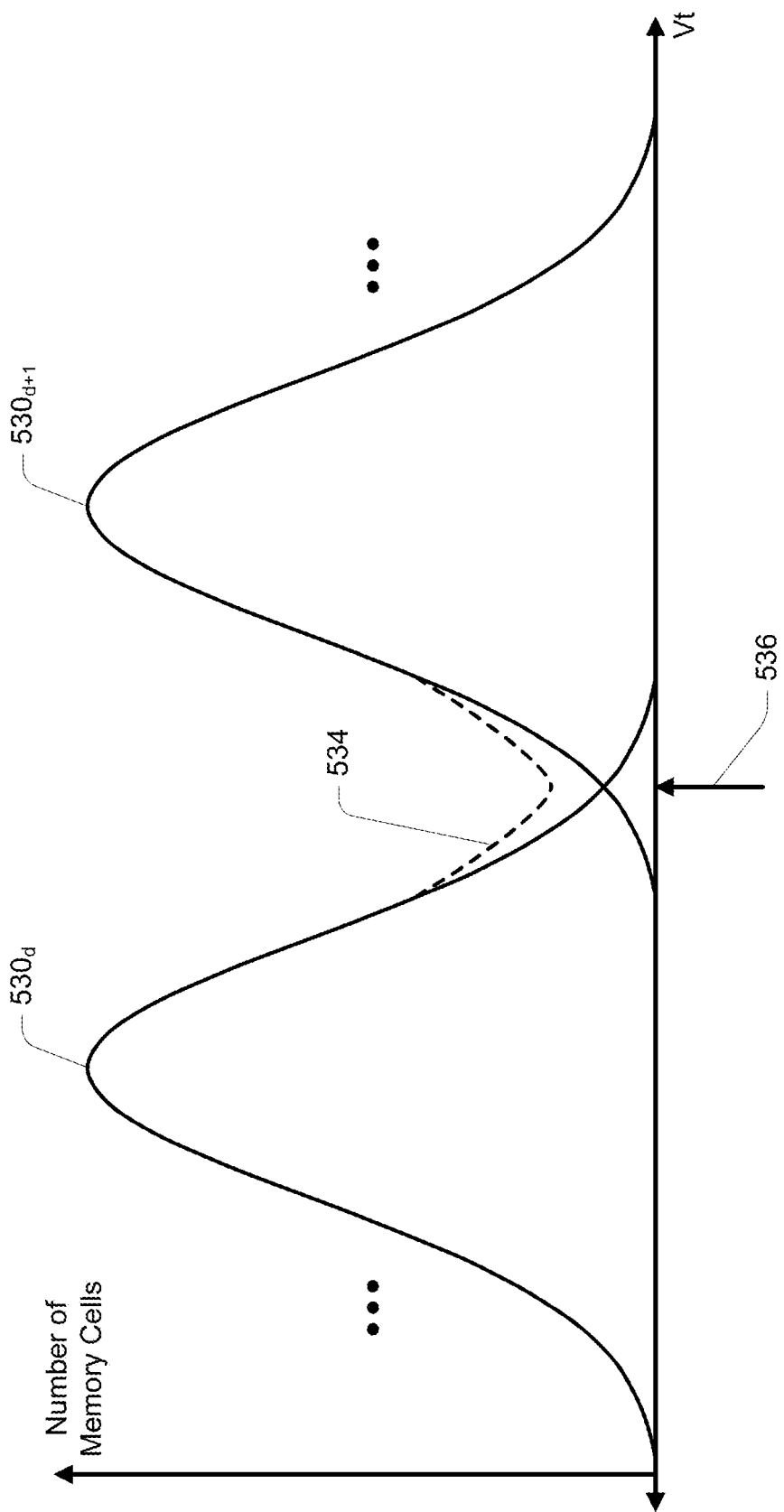

FIGS. 5A-5B are conceptual depictions of threshold voltage distributions of a plurality of memory cells at different stages following programming for use with embodiments.

Following programming, threshold voltages of memory cells may shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region. Threshold voltages of memory cells may further shift due to cumulative charge loss over the age of their programmed data, e.g., a period of time between programming the data and reading the data, referred to herein as data age. Charge loss can also be affected by memory cell age. Memory cell age, as opposed to data age, is often indicated in terms of a number of program/erase cycles the memory cells have experienced. These various phenomena might result in a widening and shifting of the threshold voltage distributions over time. Various embodiments provide apparatus and methods that may facilitate a mitigation of these concerns.

FIG. 5A is a conceptual depiction of threshold voltage distributions of a plurality of memory cells following (e.g., immediately following) a programming operation, while FIG. 5B is a conceptual depictions of those same threshold voltage distributions at some later time following that programming operation. The threshold voltage distributions $530_d$-$530_{d+1}$ of FIGS. 5A and 5B might represent some portion of the distributions for threshold voltage ranges $430_0$-$430_{15}$ of FIG. 4 at the completion of a programming operation for memory cells.

With reference to FIG. 5A, adjacent threshold voltage distributions 530 are typically separated by some margin (e.g., dead space) 532 at the completion of programming. Applying a sense voltage (e.g., read voltage) within the margin 532 to the control gates of the plurality of memory cells might be used to distinguish between the memory cells of the threshold voltage distribution $530_d$ (and any lower threshold voltage distribution) and the memory cells of the threshold voltage distribution $530_{d+1}$ (and any higher threshold voltage distribution), conceivably without error.

With reference to FIG. 5B, adjacent threshold voltage distributions might have widened, such that the threshold voltage distribution $530_d$ and the threshold voltage distribution $530_{d+1}$ might merge as represented by the curve 534 indicating a sum of the two adjacent threshold voltage distributions. The curve 534 might have a local minima 536. Where such merging of adjacent threshold voltage distributions occurs, distinguishing between memory cells intended to be in the threshold voltage distribution $530_d$ and memory cells intended to be in the threshold voltage distribution $530_{d+1}$ will generally result in some error. For example, applying a sense voltage, having a voltage level corresponding to the local minima 536, to the control gates of the plurality of memory cells might be expected to produce the least number of memory cells having a data state other than their target (e.g., intended) data state, but a certain number of errors would generally be inevitable. Applying a sense voltage higher or lower than the voltage level corresponding to the local minima 536 might be expected to produce larger numbers of errors. While applying a sense voltage having the voltage level corresponding to the local minima 536 of the curve 534 might produce the least number of errors, it may be difficult to determine at what voltage level this local minima 536 occurs.

Error correction schemes are commonly used to identify and correct erroneous digits of data. However, error correction schemes have limitations on the number of errors they are capable of identifying and correcting. Some known error correction schemes might utilize error correction code (ECC) data conforming to Hamming codes, horizontal/vertical parity codes, convolution codes, Recursive Systematic Codes (RSC), Trellis-Coded Modulation (TCM), Block Coded Modulation (BCM), Bose-Chaudhuri-Hocquenghem (BCH) codes, Reed-Solomon codes, turbo codes, cyclic redundancy codes (CRC) or low density parity check (LDPC) codes, although this disclosure is not limited to a particular error correction scheme or its coding. The number of correctable errors generally can be increased through the use of larger amounts of error correction code data, or through the use of more robust error correction schemes, but these generally require more storage space and more computation time, respectively, to effect the corrections. As such, it is generally advantageous to reduce the number of errors during sensing. Error correction of data errors is well understood in the art and will not be detailed herein.

Figure 6:
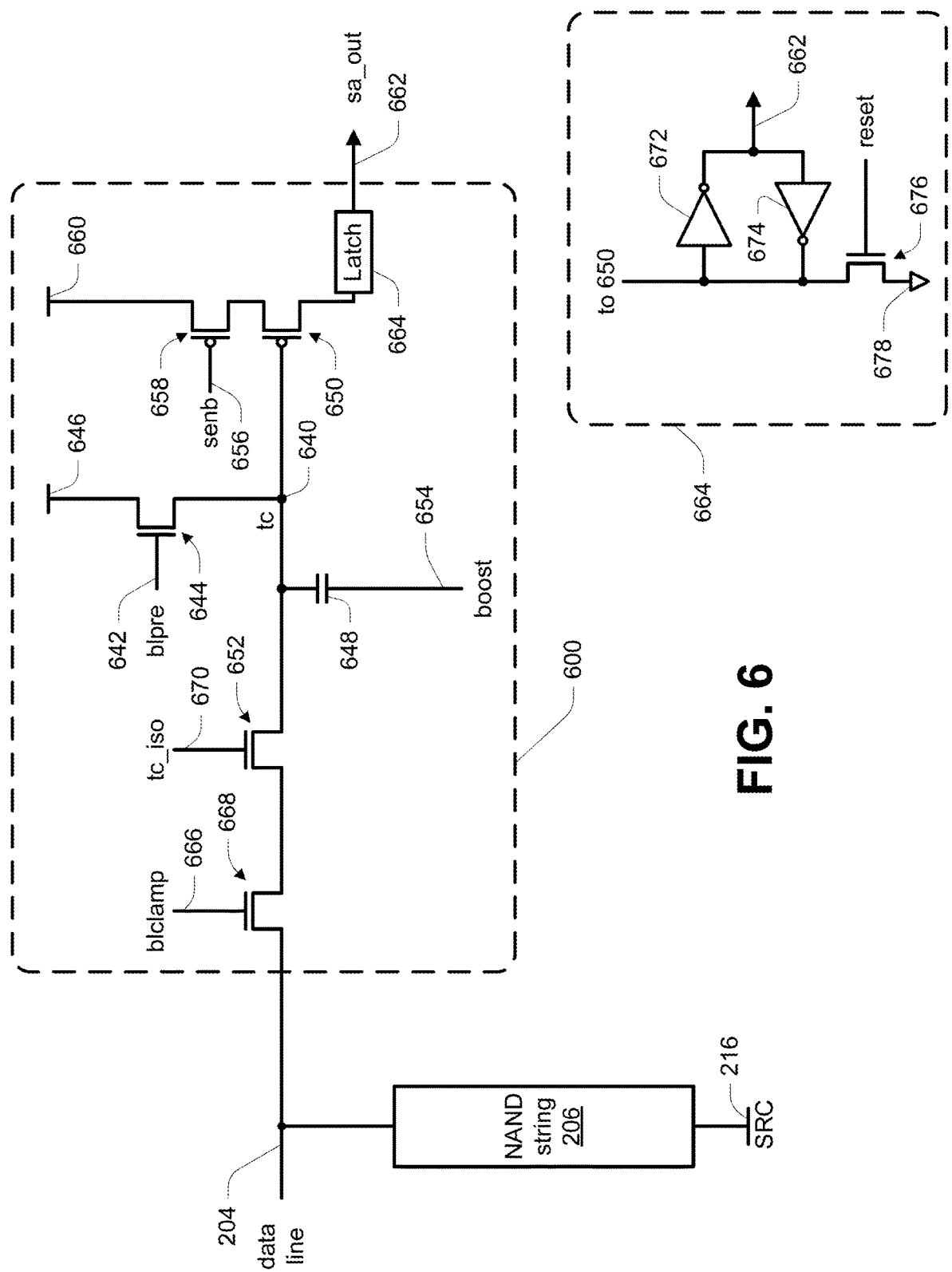
FIG. 6 is a schematic of a sense circuit of a type that might be used with various embodiments.

Sense circuits are typically utilized in memory devices to facilitate performing a sense (e.g., read and/or verify) operation on each of one or more selected (e.g., target) memory cells in the memory device. FIG. 6 illustrates a sense circuit 600 of a type that might be used with various embodiments. Sense circuit 600 is shown connected to a particular NAND string 206 by a particular data line 204, such as shown in more detail in FIG. 2A, for example. Note that select transistors 210 and 212 selectively connecting the NAND string 206 to the source 216 and data line 204, respectively, are not shown in FIG. 6. While the discussion is directed to use of the sense circuit 600 with a NAND string 206, other memory structures and architectures are suitable for use with sense circuit 600 where a current path can be selectively created from the data line 204 to the source 216 dependent upon a data state of a memory cell selected for sensing.

As part of a sense operation, e.g., a precharge portion, the sense circuit 600 may precharge a sense node (e.g., tc node) 640 by activating a precharge transistor (e.g., n-type field effect transistor, or nFET) 644 by biasing (e.g., driving) the signal line 642 to a particular voltage level (e.g., a voltage level of control signal blpre) sufficient to activate the transistor 644. Control signals of the sense circuit 600 may be provided by the internal controller (e.g., control logic 116) of the memory device 100. Such control signals (e.g., both voltage levels and timing) may be defined by the sense operation and are distinguished from signals generated in response to performing the sense operation (e.g., the output signal sa_out or a voltage level generated on the sense node 640). A sense operation might be a read operation, e.g., for providing data output from the array of memory cells, or a verify operation, e.g., for verifying whether a programming pulse successfully changed a threshold voltage of a target memory cell to indicate its desired data state.

Transistor 644 is connected between a voltage node 646 and the sense node 640. Voltage node 646 might be configured to receive a supply voltage, e.g., Vcc. For some embodiments, voltage node 646 may be a variable voltage node. The capacitance 648 shown coupled to the sense node 640 may be representative of the capacitance at the sense node 640 and additional circuitry connected to it, e.g., transistors 644, 650 and 652. Voltage node 654 (e.g., a variable voltage node) is configured to apply a voltage level to the capacitance 648 which may induce a change in voltage level on the sense node 640, for example, to boost the sense node 640 to a higher voltage level, such as through capacitive coupling.

Additional transistors of the sense circuit 600 facilitate sensing of a voltage level on the sense node 640. For example, the control gate of a sense transistor (e.g., p-type field effect transistor, or pFET) 650 is shown connected to the sense node 640. Thus, transistor 650 is configured to be responsive to a voltage level present on the sense node 640. Signal line 656 connected to the gate of a sense enable transistor (e.g., pFET) 658 and configured to receive control signal senb facilitates isolating the transistor 650 from the voltage node 660, which may be configured to receive a supply voltage, e.g., Vcc. The sense circuit output (e.g., sa_out) line 662 might be connected to additional circuitry (not shown in FIG. 6) of the memory device configured to respond to the sense circuit 600 as part of a sensing operation. For example, the sense circuit 600 may be a component of the data register 120 of FIG. 1 and its output sa_out may be provided as an input to the cache register 118 for output of the sensed data state from the memory device 100. The output signal sa_out on output line 662 might comprise a signal generated by a latch (e.g., latch circuit) 664 which is representative of a logic level, such as a logic 'high' (e.g., represented by Vcc) or logic 'low' (e.g., represented by Vss) level indicative of a sensed data state of a selected memory cell of NAND string 206, for example. Latch 664 may be configured as a pair of cross-coupled inverters, for example. For example, a latch 664 might include a first inverter 672 having an input connected to an output of a second inverter 674 and to the transistor 650, and having an output connected to an input of the second inverter 674. A reset transistor (e.g., nFET) 676 might be connected between the input of the first inverter 672 and a voltage node 678 that might be connected to receive a reference potential, e.g., Vss, ground or 0V. Between sense operations, the gate of transistor 676 might be biased by a voltage level (e.g., of control signal reset) to connect the input of the first inverter 672 to the voltage node 678 to return the output line 662 of the latch 664 to a default logic level, e.g., a logic high level. For some embodiments, latch 664 might be eliminated, connecting the output line 662 to the transistor 650.

During a precharge portion of a sense operation, the gate of transistor 644 might be biased by a voltage level (e.g., of control signal blpre) on signal line 642 to precharge the sense node 640 by injecting a precharge current into the sense node 640. An additional voltage level (e.g., of control signal blclamp) may be applied to signal line 666 to activate transistor (e.g., nFET) 668, and a further voltage level (e.g., of control signal tc_iso) may be applied to signal line 670 to activate transistor (e.g., nFET) 652. Activating transistors 644, 652 and 668 can serve to connect data line 204 to the voltage node 646, thereby precharging the sense node 640 and the data line 204.

Following the precharging of the sense node 640 and the data line 204, a second portion of the sense operation might be performed to detect whether or not the precharged data line 204 and sense node 640 is discharged during the sense operation, thereby determining the data state of the memory cell selected for sensing. In general, following the precharging of the sense node 640 and the data line 204, the sense node 640 may be isolated from the data line 204, such as by deactivating the transistor 668 and/or deactivating the transistor 652. The data line 204 can then be selectively connected to the source 216 depending upon whether the memory cell selected for sensing is activated or deactivated in response to a sense voltage applied to its control gate. After the data line 204 is given an opportunity to discharge if current is flowing through the NAND string 206, the sense node 640 may again be connected to the data line 204 by activating the transistors 652 and 668. If a voltage level of the data line 204 is lower than the precharge voltage level due to current flow through the NAND string 206, the voltage level of the sense node 640 will likewise experience a drop. If the voltage level of the data line 204 remains at the precharge voltage level, such as when the memory cell selected for sensing remains deactivated, the voltage level of the sense node 640 may remain at its precharge (or boosted) voltage level. With the transistor 658 activated, and the voltage level of the sense node 640 applied to the control gate of the transistor 650, the voltage node 660 may be selectively connected to the latch 664 depending upon a voltage level of the sense node 640. The latch 664 may have a particular logic level (e.g., logic high) prior to sensing. If the voltage level of the voltage node 660 is applied to the input of the latch 664 upon activation of the transistor 658, its logic level may change, e.g., from a logic high level to a logic low level, and if the voltage node 660 remains isolated from the input of the latch 664 upon activation of the transistor 658, its logic level may remain at the particular logic level.

Various embodiments may utilize boosting and deboosting of the sense node 640 during the sense operation. Boosting (e.g., capacitively coupling a first boost voltage level to) and deboosting (e.g., capacitively coupling a second, lower, boost voltage level to) the sense node 640 might be used, for example, to facilitate a higher develop overhead. By boosting the sense node 640 prior to the sense node develop time, the voltage level of the sense node 640 can be allowed to develop longer without prematurely indicating current flow of the data line 204. Subsequent deboosting of the sense node 640 after isolation from the NAND string 206 from the data line 204 may permit the voltage level of the sense node 640 to drop below the trip point (e.g., threshold voltage) of the transistor 650 to indicate that current flow (e.g., a threshold level of current flow) was detected.

It is noted that data lines corresponding to activated memory cells having threshold voltages nearer the sense voltage applied to their control gates might be expected to experience lower levels of discharge and higher resulting voltage levels of the sense node 640 than data lines corresponding to activated memory cells having threshold voltages farther from the sense voltage applied to their control gates. Accordingly, sense nodes 640 indicating activation of their corresponding memory cell at one boost voltage level during deboosting might indicate deactivation of their corresponding memory cell at a different (e.g., higher) boost voltage level during deboosting. This phenomena can be used to compensate for a sense voltage that is higher or lower than the local minima between two adjacent threshold voltage distributions. Various embodiments utilize multiple boost voltage levels coupled to a sense node during a single sensing operation to estimate the conditions that might indicate activation of those memory cells having threshold voltages below that local minima, and might indicate deactivation of those memory cells having threshold voltages above that local minima, e.g., estimating the location of that local minima.

The trip point of the sense circuit 600 may generally be dependent upon the threshold voltage of the transistor 650. The sense circuit 600 is typically configured to have a trip point (e.g., sense threshold level) close to the precharge voltage level that may be established on the sense node 640 prior to sensing the selected memory cell. The trip point might be a particular voltage level on the sense node 640 wherein the sense circuit 600 outputs a first logic level indicative of a first state of the sense node 640, e.g., when the voltage level of the sense node 640 is equal to or above the trip point. The sense circuit 600 might output a second logic level indicative of a second state of the sense node 640, e.g., when the voltage level of the sense node 640 is below the trip point, for example. The sensed state of the sense node 640 can be used to provide an indication of the data state of the sensed memory cell.

Figure 7:
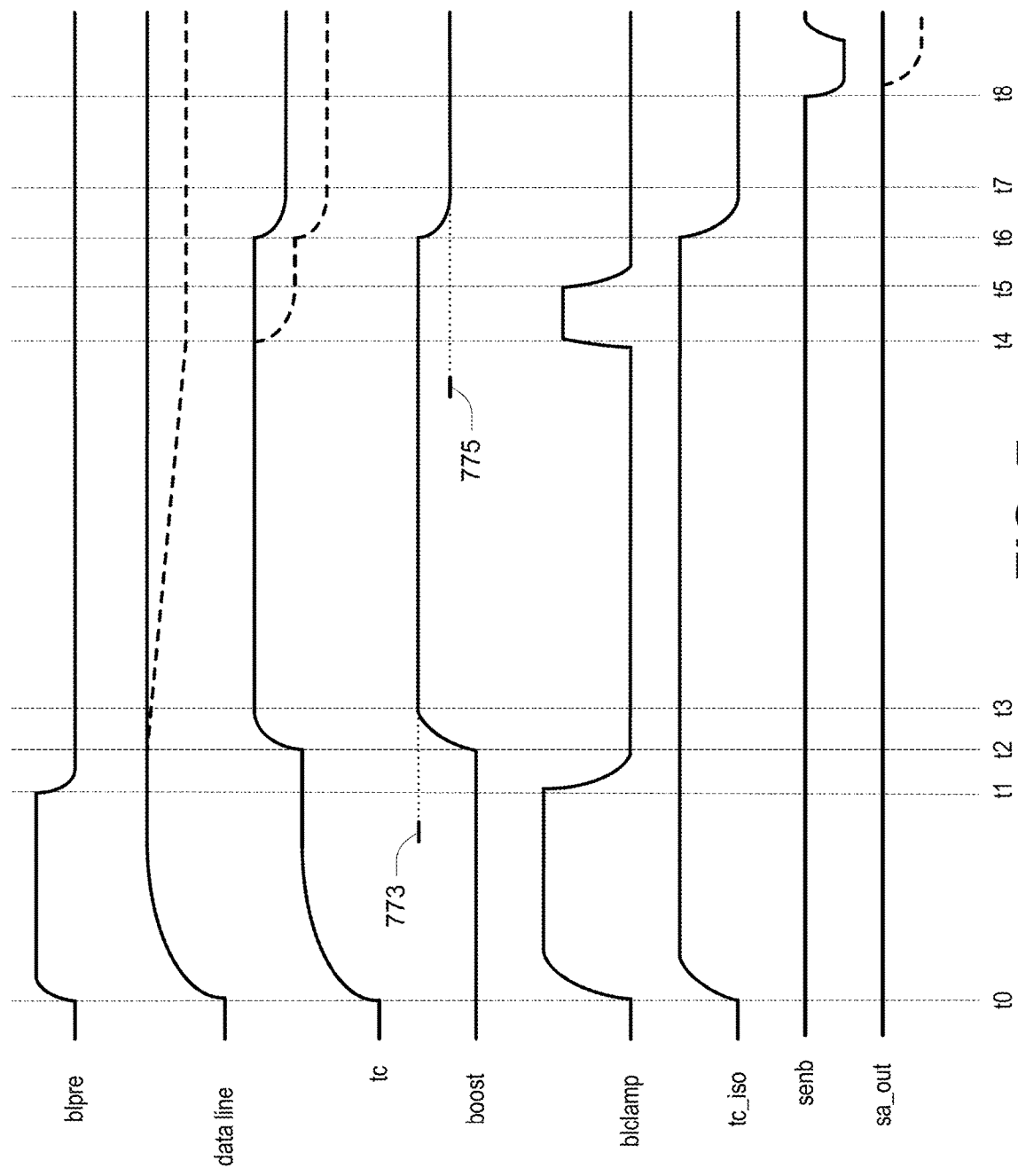
FIG. 7 is a timing diagram generally depicting voltage levels of various nodes of a sense circuit such as depicted in FIG. 6 at various stages of a sense operation in accordance with an embodiment.

FIG. 7 is a timing diagram generally depicting voltage levels of various nodes of a sense circuit such as the sense circuit 600 depicted in FIG. 6 at various stages of a sense operation in accordance with an embodiment. FIG. 7 provides detail of a portion of a sense operation that might be used with embodiments. With regard to FIG. 7, a precharge portion of the sense operation may begin at time t0 by biasing control signals blpre, blclamp and tc_iso to voltage levels sufficient to activate transistors 644, 668 and 652, respectively, thereby connecting the data line 204 and the sense node 640 to the voltage node 646. In response, the voltage level tc of the sense node 640 and the voltage level of the data line 204 might increase. At time t1, the sense node 640 may be isolated from the data line 204 and the voltage node 646, such as by biasing control signals blpre and blclamp to voltage levels sufficient to deactivate the transistors 644 and 668. Note that the control signal tc_iso may remain at the level sufficient to activate the transistor 652 as transistor 668 can provide isolation from the data line 204.

Between time t1 and time t4, the data line 204 is selectively connected to the source 216 depending upon whether the memory cell selected for sensing is activated or not in response to the sense voltage. If the memory cell is activated, the data line 204 may decrease in voltage as current flows through the NAND string 206, such as depicted in dashed line, and if the memory cell is deactivated, the data line 204 may remain at the precharge voltage level, such as depicted in solid line. An activated memory cell having a particular threshold voltage might be expected to discharge more quickly than an activated memory cell having a threshold voltage higher than the particular threshold voltage.

At time t2, a first boost voltage level 773 might be applied at voltage node 654, thereby boosting the voltage level of the sense node 640 to a boosted voltage level (e.g., higher than the precharge voltage level) at time t3. At time t4, the sense node 640 might again be connected to the data line 204, such as by biasing control signal blpre to a voltage level sufficient to activate the transistor 668, and, where the data line 204 has discharged, the voltage level of the sense node 640 might be expected to decrease such as depicted in dashed line tc.

At time t5, the sense node 640 might be isolated from the data line 204, such as by biasing control signals blclamp and/or tc_iso to voltage levels sufficient to deactivate one or both transistors 652 and 668. At time t6, after the sense node 640 has been connected to, and subsequently isolated from, the data line 204, a second boost voltage level 775 (which might be lower than the first boost voltage level 773) might be applied to the voltage node 654. The change in the boost voltage level from the boost voltage level 773 to the boost voltage level 775 might result in a corresponding change in the voltage level tc of the sense node 640.

At time t8, the transistor 650 might be connected to the voltage node 660 by biasing the control signal senb to a voltage level sufficient to activate the transistor 658. If the transistor 650 is activated, the voltage node 660 is connected to the latch 664, thereby changing the logic level of the output signal sa_out, and if the transistor 650 is deactivated, the voltage node 660 remains isolated from the latch 664, allowing the logic level of the output signal sa_out to remain unchanged. While this example describes a change in logic level of the output signal sa_out (e.g., a change in the logic level of the latch 664) from a logic high level to a logic low level as indicating the voltage level of the sense node 640 being below the trip point of the transistor 650, a transition from a logic low level to a logic high level could alternatively be provided with appropriate changes in the latch 664, e.g., by providing an additional inverter to the output of the latch.

As previously noted, activated memory cells might discharge their corresponding data lines 204 at different rates, which can result in differing voltage levels of their corresponding sense nodes 640. Accordingly, selection of the magnitude of the boost voltage level 775 might be used to limit which of the activated memory cells result in a change in logic level of the output signal sa_out. For example, where a number of memory cells are sensed in parallel, it might be expected that higher voltage levels of the boost voltage level 775 would result in fewer sense nodes 640 indicating activation of their corresponding memory cells. By determining a respective difference between a number of memory cells activated (or deactivated) at a respective first boost voltage level 775 and a number of memory cells activated (or deactivated) at a respective second boost voltage level 775, for multiple groupings of memory cells, histograms can be determined for different ranges of boost voltage levels 775. These histograms might be used to provide an estimate of a desired boost voltage level 775 that could indicate activation at the local minima 536 of FIG. 5B.

Figure 8:
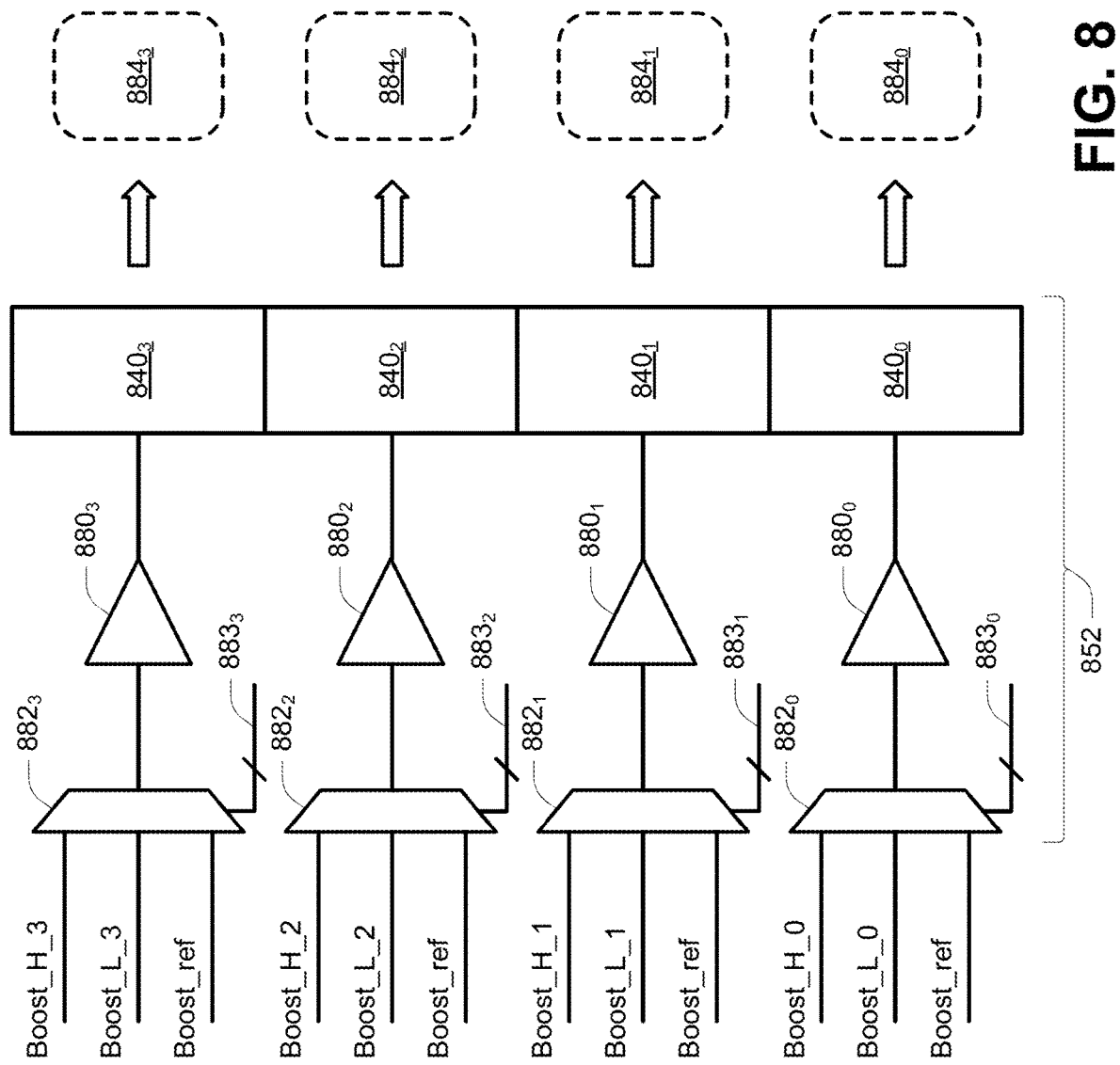
FIG. 8 is a block diagram of a portion of a page buffer in accordance with an embodiment.

FIG. 8 is a block diagram of a portion of a page buffer 852 in accordance with an embodiment. The page buffer 852 might include buffer portions 840 (e.g., buffer portions $840_0$-$840_3$). Buffer portions 840 might correspond to buffer portions 240 of FIGS. 2C and 3. Each buffer portion 840 might include a sense circuit (e.g., sense circuit 600) for each, or every other, corresponding data line, for example. Each buffer portion 840 might have a corresponding driver 880 (e.g., drivers $880_0$-$880_3$) having an output connected to that buffer portion 840 to provide a boost voltage to each of its sense circuits (e.g., to a variable voltage node 654 of a sense circuit 600). Each driver 880 might have an input connected to an output of a corresponding multiplexer 882 (e.g., multiplexers $882_0$-$882_3$).

Each multiplexer 882 might be responsive to a control signal received on a respective control signal line 883 (e.g., control signal lines $883_0$-$883_3$) to select one of a number of input voltage levels for output to its corresponding driver 880. It is noted that the drivers 880 might be eliminated, with each multiplexer 882 connected (e.g., directly connected) to its corresponding buffer portion 840 to provide a selected boost voltage level to each sense circuit of that corresponding buffer portion 840. Similarly, multiplexers 882 might be combined. For example, multiplexers $882_0$ and $882_1$ might be combined as a 5:2 multiplexer (or 4:2 multiplexer as will be described later), or multiplexers $882_0$-$882_3$ might be combined as a 9:4 multiplexer (or 6:4 multiplexer as will be described later).

In general, the boost voltage level Boost_ref might represent a desired, e.g., calibrated, boost voltage level determined (e.g., calculated) in accordance with embodiments. Remaining boost voltage levels provided to the inputs of the multiplexers 882 might satisfy the conditions that Boost_H_3≠Boost_H_2≠Boost_H_1≠Boost_H_0 and Boost_L_3≠Boost_L_2≠Boost_L_1≠Boost_L_0. In addition, these boost voltage levels might satisfy the conditions Boost_H_3>Boost_H_2>Boost_H_1>Boost_H_0 and Boost_L_3>Boost_L_2>Boost_L_1>Boost_L_0. The range of boost voltage levels might be chosen to span a same range of voltage levels as an expected range of voltage levels for the curve 534 of FIG. 5B, and may further include voltage levels between the curve 534 and the expected apexes of the threshold voltage distributions $530_d$ and $530_{d+1}$. The expected range of voltage levels for the curve 534 and the expected apexes of the threshold voltage distributions $530_d$ and $530_{d+1}$ might be determined experimentally, empirically or through simulation. In this manner, the voltage level of Boost_L_0 might be expected to be lower than a sense voltage used to distinguish between the data states corresponding to the threshold voltage distributions $530_d$ and $530_{d+1}$, and the voltage level of Boost_H_3 might be expected to be higher than an expected boost voltage level to be used to distinguish between the data states corresponding to the threshold voltage distributions $530_d$ and $530_{d+1}$.

For some embodiments, Boost_L_3=Boost_H_2, Boost_L_2=Boost_H_1, and Boost_L_1=Boost_H_0. For such embodiments, using the example of FIG. 8, a combined multiplexer could utilize a number of inputs less than the number of the named boost voltage levels for its corresponding buffer portions 840. For example, multiplexers $882_0$ and $882_1$ might be combined as a 4:2 multiplexer receiving the boost voltage levels Boost_ref, Boost_H_1, Boost_H_0 and Boost_L_0, where Boost_L_1=Boost_H_0.

In response to buffer portion $840_0$ sensing the states of the sense nodes 640 of its sense circuits using its corresponding boost voltage levels Boost_L_0 and Boost_H_0, an indication of a number of sense nodes 640 changing states between sensing with the boost voltage level Boost_L_0, and sensing with the boost voltage level Boost_H_0, might be determined. That indication might be a count fail byte (CFByte) $884_0$. The CFByte $884_0$ might represent a magnitude of a difference in a number of sense circuits of the buffer portion $840_0$ having a particular logic level (e.g., a logic low level) when sensed while the boost voltage level Boost_L_0 is applied, and a number of sense circuits of the buffer portion $840_0$ having the particular logic level when sensed while the boost voltage level Boost_H_0 is applied. This process might be repeated for each remaining buffer portion 840 (e.g., buffer portions $840_1$-$840_3$) to determine their corresponding CFByte 884 (e.g., CFBytes $884_1$-$884_3$, respectively). A CFByte 884 might count each sense circuit of its corresponding buffer portion 840, or it might count some subset or logical combination of subsets. For example, a CFByte 884 might count only a particular bit position for each byte (or other grouping) of data of its corresponding buffer portion 840, e.g., a count based on one of every eight sense circuits. Alternatively, the indication of a number of sense nodes 640 changing state might utilize a logical function (e.g., ORing) of the states of the sense nodes 640 for some subset of bit positions for each byte (or other grouping) of data of the corresponding buffer portion 840, which might include all bit positions of each byte (or other grouping) of data, in determining the difference.

While four buffer portions 840 are depicted in FIG. 8, providing for generation of four CFBytes 884, two or more buffer portions 840 might be used for generating two or more corresponding CFBytes 884. While higher numbers of CFBytes 884 might provide for improved accuracy in estimating the location of the local minima 536 of FIG. 5B, higher numbers of CFBytes 884 might require higher numbers of voltage generation devices to develop additional boost voltage levels, or additional sense time as will be described with reference to FIGS. 10A-10C.

Figure 9A:
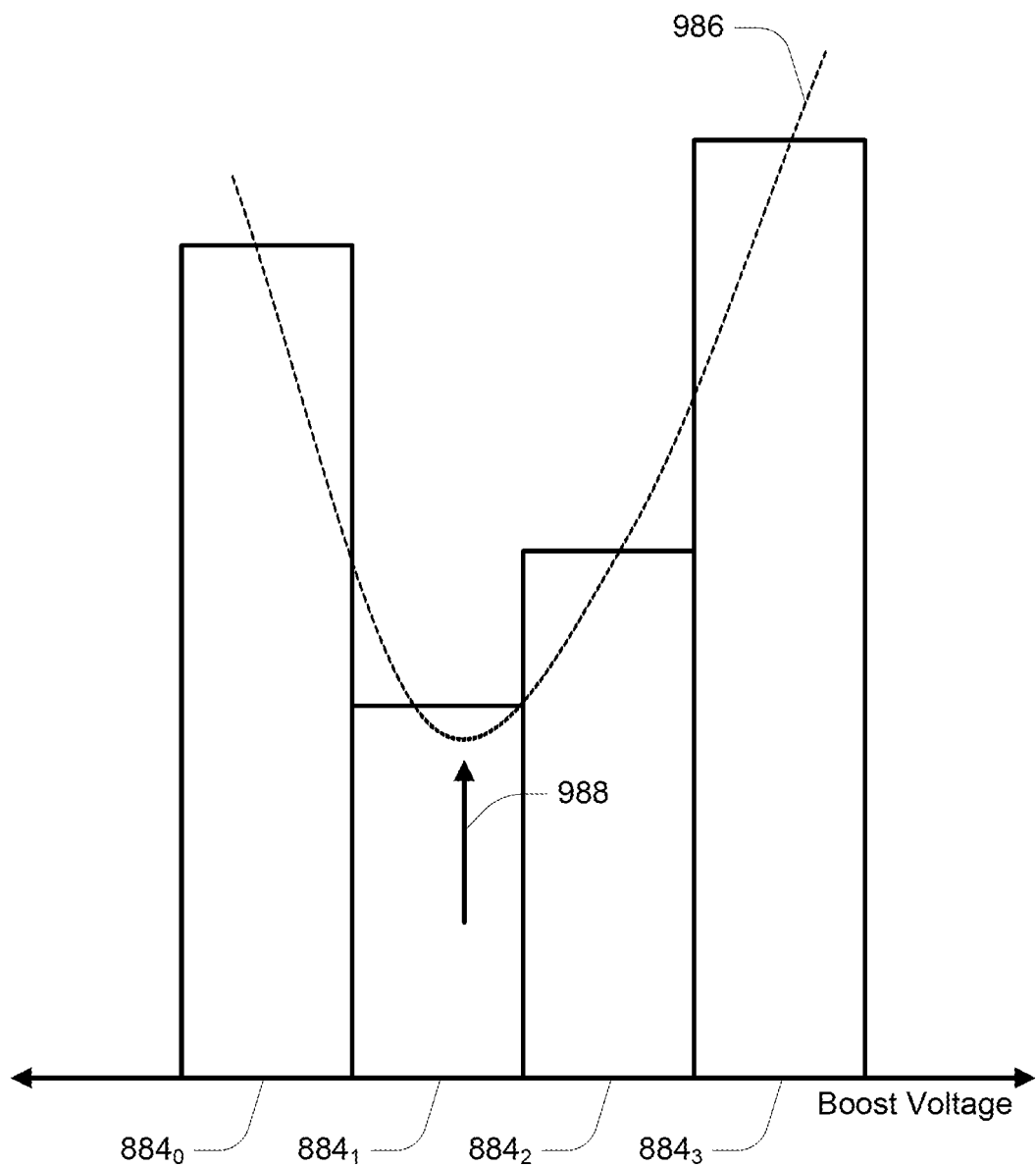
FIGS. 9A-9B are example plots of possible histograms representing indications of a number of sense nodes changing state as a function of boost voltage levels in accordance with embodiments.

FIG. 9A is an example plot of possible histograms representing indications of a number of sense nodes changing state as a function of boost voltage levels in accordance with an embodiment. In particular, FIG. 9A might represent an example plot of possible histograms representing the values of CFBytes 884 of FIG. 8 as a function of boost voltage levels. A curve 986 might be determined in response to the values of the CFBytes $884_0$-$884_3$ in manners mathematically well understood. The curve 986 might have a local minima 988. The boost voltage level corresponding to the local minima 988 might be selected as the boost voltage level Boost_ref. Embodiments herein are not dependent upon a manner of regression of the values of the CFBytes 884. Alternatively, the boost voltage level Boost_ref might be determined to be equal to some value between the boost voltage levels used in determining the CFByte 884 having the lowest value, e.g., CFByte $884_1$ in this example, using the boost voltage levels Boost_L_1 and Boost_H_1. For example, the boost voltage level Boost_ref might be determined to be equal to the mean of Boost_L_1 and Boost_H_1. Other manners of determining a value of the boost voltage level Boost_ref in response to values of the CFBytes 884 might further be used.

While three or more histograms might provide an ability to directly regress a curve estimating a location of the local minima 988, embodiments utilizing two histograms might be used to estimate a location of the local minima 988. For example, knowledge of an expected number of memory cells having each possible data state, and knowledge of an expected shape of the threshold voltage distributions might be used to estimate a shape of the curve 534 of FIG. 5B indicating a sum of two adjacent threshold voltage distributions.

Data randomization is often used to mitigate coupling effects between closely neighboring memory cells that can disturb the intended data states. While generally referred to as data randomization in the art, it is recognized that the data is not truly randomized in a mathematical sense. Instead, randomization generally refers to a redistribution of data values in a reversible manner. As a result of data randomization, each possible data state to which a memory cell can be programmed in a programming operation might be programmed to a similar (e.g., the same) number of memory cells. For example, where 4K (e.g., 4096) memory cells are each programmed to one of sixteen possible data states (e.g., data states L0-L15), each possible data state might be expected to programmed to a number of memory cells substantially equal to (e.g., equal to) 256 (e.g., 4096/16) memory cells where data randomization is utilized. Similarly, the shifting and spreading of threshold voltage distributions resulting from data age and memory cell age might be determined experimentally, empirically or through simulation. With knowledge of the number of memory cells, and of the expected shifting and widening of their threshold voltage distributions, the shape of the curve between two adjacent threshold voltage distributions can be estimated.

Figure 9B:
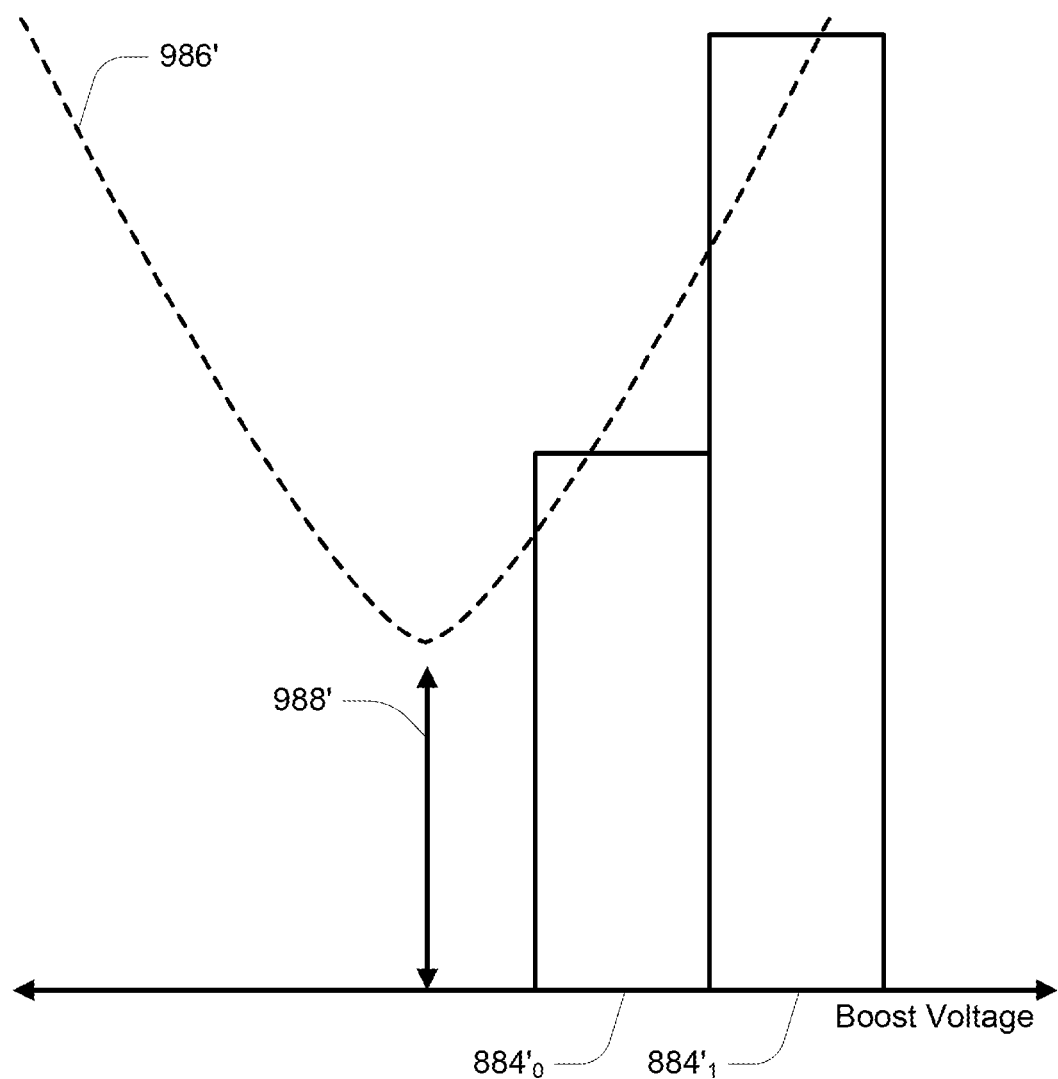

FIG. 9B is an example plot of possible histograms representing indications of a number of sense nodes changing state as a function of boost voltage levels in accordance with another embodiment. In FIG. 9B, an expected curve 986' of two adjacent threshold voltage distributions might be determined in response to the data age and memory cell age of the memory cells being sensed, and the expected numbers of memory cells in two adjacent threshold voltage distributions. The expected curve 986' might correspond to the curve 534 of FIG. 5B and have a local minima 988' corresponding to the local minima 536 of FIG. 5B, for example. The expected curve 986' might be fitted to the two (or more) histograms of CFBytes $844'_0$ and $844'_1$ determined in a manner similar to that described with reference to FIG. 8, and the local minima 988' might correspond to a desired boost voltage level Boost_ref. Alternatively, the boost voltage level Boost_ref might be determined to be equal to some value between the boost voltage levels used in determining the CFByte 884' having the lowest value, e.g., CFByte $884'_0$ in this example. For example, the boost voltage level Boost_ref might be determined to be equal to the mean of the boost voltage levels used in determining the value of CFByte $884'_0$.

Figure 10A:
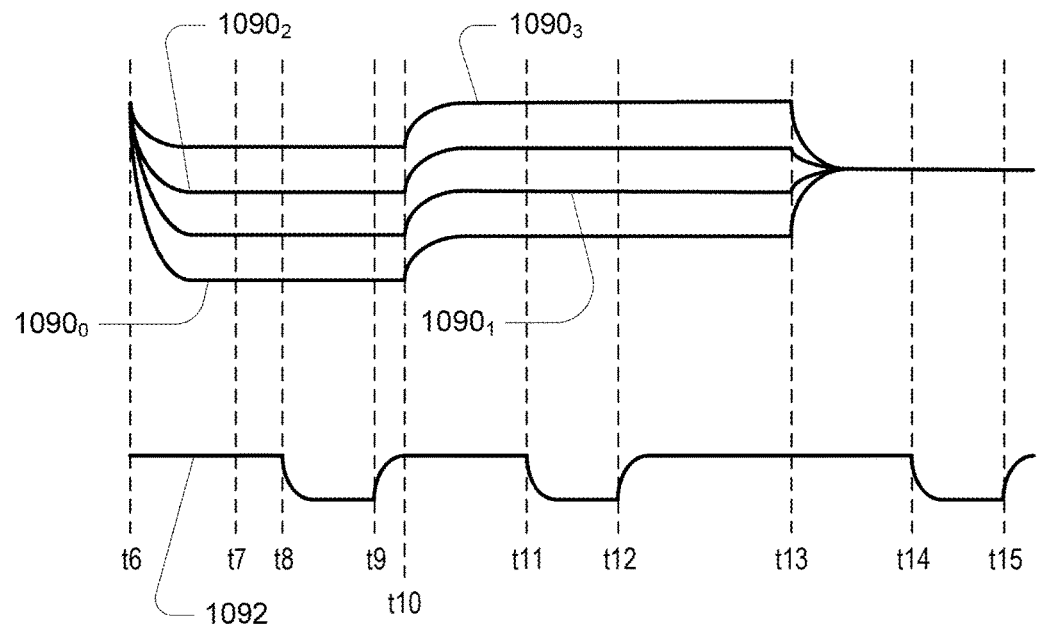
FIGS. 10A-10C are timing diagrams generally depicting voltage levels of certain nodes of sense circuits such as depicted in FIG. 6 at various stages of sense operations in accordance with embodiments.
Figure 10B:
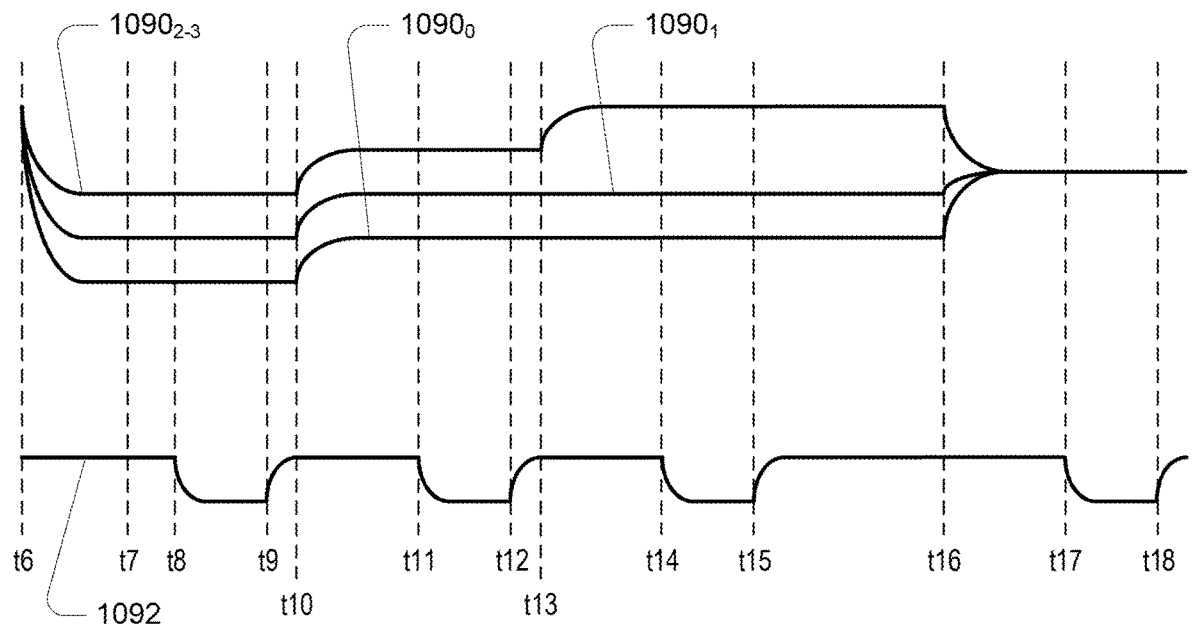
Figure 10C:
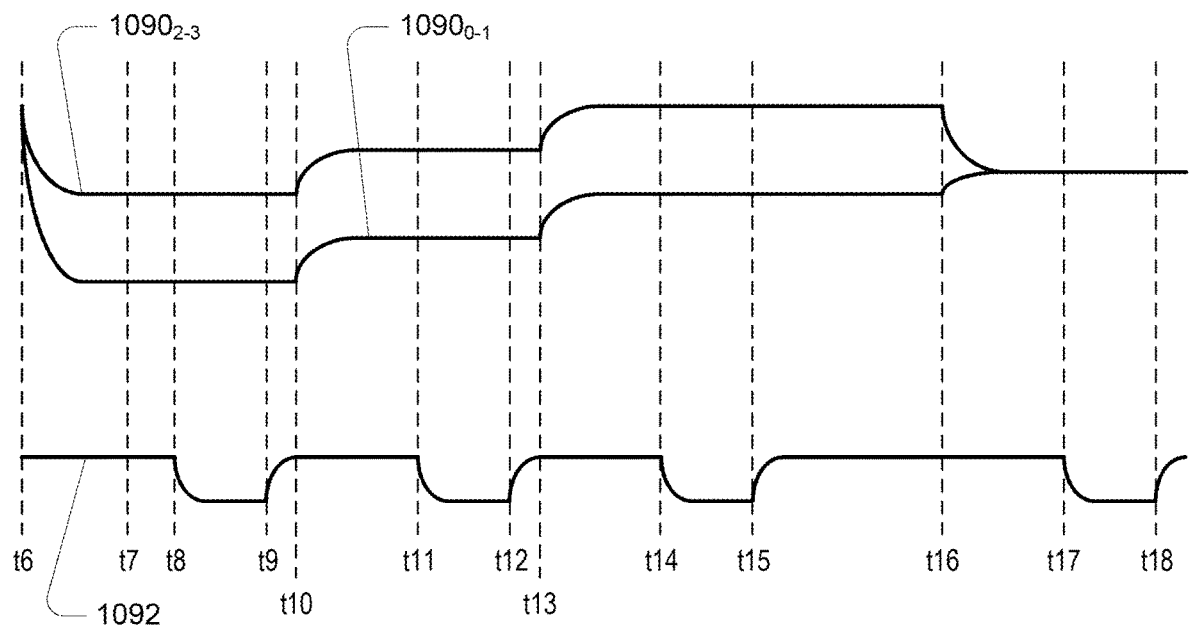

FIGS. 10A-10C are timing diagrams generally depicting voltage levels of certain nodes of sense circuits such as depicted in FIG. 6 at various stages of sense operations in accordance with embodiments. FIGS. 10A-10C provide details of alternative portions of a sense operation that might be used with embodiments. The timing diagrams of FIGS. 10A-10C might start at time t6 of FIG. 7, for example, at a beginning of a deboosting portion of a sense operation.

With respect to FIG. 10A, line $1090_0$ might represent a boost voltage level capacitively coupled to one or more sense nodes 640 of sense circuits of the buffer portion $840_0$, line $1090_1$ might represent a boost voltage level capacitively coupled to one or more sense nodes 640 of the buffer portion $840_1$, line $1090_2$ might represent a boost voltage level capacitively coupled to one or more sense nodes 640 of the buffer portion $840_2$, and line $1090_3$ might represent a boost voltage level capacitively coupled to one or more sense nodes 640 of the buffer portion $840_3$. Line 1092 might represent the voltage level of the control signal senb provided to the signal lines 656 corresponding to each of these sense nodes 640.

At time t8, the boost voltage level of line $1090_0$ might represent the boost voltage level Boost_L_0, the boost voltage level of line $1090_1$ might represent the boost voltage level Boost_L_1, the boost voltage level of line $1090_2$ might represent the boost voltage level Boost_L_2, and the boost voltage level of line $1090_3$ might represent the boost voltage level Boost_L_3.

Between times t8 and t9, sensing (e.g., a first sensing) can be enabled, or strobed, and based on the values of the outputs 662 of the sense circuits, a respective first count can be made of a number of sense circuits indicating a particular logic level, such as a logic low level. Because of the complementary nature of the sense circuits, the particular logic level might be chosen to indicate a change in state (e.g., a particular level of discharge) of its sense node 640, or it might be chosen to indicate no change in state (e.g., a lesser level of discharge) of its sense node 640, as each choice would provide information suitable for estimating a location of a local minima of the threshold voltage distributions. At time t10, the boost voltage level of line $1090_0$ might be increased to the boost voltage level Boost_H_0, the boost voltage level of line $1090_1$ might be increased to the boost voltage level Boost_H_1, the boost voltage level of line $1090_2$ might be increased to the boost voltage level Boost_H_2, and the boost voltage level of line $1090_3$ might be increased to the boost voltage level Boost_H_3. The latches 664 of the sense circuits might be reset to a default logic level, which might be different than the particular logic level, such as a logic high level.

Between times t11 and t12, sensing (e.g., a second sensing) can be enabled, or strobed, and based on the values of the outputs 662 of the sense circuits, a respective second count can be made of a number of sense circuits indicating the particular logic level. A respective value of a CFByte 884 for each of the buffer portions 840 might be equal to an absolute value of a difference between the respective first count and the respective second count for each of the buffer portions 840. The latches 664 of the sense circuits might be reset to the default logic level.

Between times t12 and t13, a determination might be made, responsive to the determined CFBytes 884, of a desired, e.g., calibrated, value of the boost voltage level, e.g., Boost_ref, that might be deemed to mitigate a number of bit errors of the sense operation. At time t13, the boost voltage level of lines $1090_0$, $1090_1$, $1090_2$ and $1090_3$ might each be transitioned to the boost voltage level Boost_ref, which might have a value different than, or the same as, Boost_L_0, Boost_H_0, Boost_L_1, Boost_H_1, Boost_L_2, Boost_H_2, Boost_L_3 or Boost_H_3. As such, a line 1090 may transition higher, transition lower or remain at its previously applied boost voltage level. As used herein, a line 1090 remaining at its previously applied boost voltage level will be deemed to have transitioned to the boost voltage level Boost_ref, but having a magnitude of 0V.

Between times t14 and t15, sensing (e.g., a third or final sensing) can be enabled, or strobed, and based on the values of the outputs 662 of the sense circuits, a determination might be made as to the data states of the target memory cells corresponding to the sense circuits of the buffer portions 840.

The embodiment depicted in FIG. 10A might utilize four voltage generators (not shown) for generating the various voltage levels of lines $1090_0$-$1090_3$. Other embodiments can facilitate the parallel determination of at least some CFByte 884 values using fewer voltage generators. For example, the embodiment of FIG. 10B might utilize three voltage generators for generating the various voltage levels of lines $1090_0$-$1090_3$, while the embodiment of FIG. 10C might utilize two voltage generators for generating the various voltage levels of lines $1090_0$-$1090_3$. However, the use of fewer voltage generators might involve more sense strobes to determine the values of the CFBytes 884.

With respect to FIG. 10B, line $1090_0$ might represent a boost voltage level capacitively coupled to one or more sense nodes 640 of sense circuits of the buffer portion $840_0$, line $1090_1$ might represent a boost voltage level capacitively coupled to one or more sense nodes 640 of the buffer portion $840_1$, and line $1090_{2\text{-}3}$ might represent a boost voltage level capacitively coupled to one or more sense nodes 640 of the buffer portions $840_2$ and $840_3$. Line 1092 might represent the voltage level of the control signal senb provided to the signal lines 656 corresponding to each of these sense nodes 640.

At time t8, the boost voltage level of line $1090_0$ might represent the boost voltage level Boost_L_0, the boost voltage level of line $1090_1$ might represent the boost voltage level Boost_L_1, the boost voltage level of line $1090_{2\text{-}3}$ might represent the boost voltage level Boost_L_2.

Between times t8 and t9, sensing (e.g., a first sensing) can be enabled, or strobed, and based on the values of the outputs 662 of the sense circuits, a respective first count can be made of a number of sense circuits of the buffer portions $840_0$, $840_1$ and $840_2$ indicating a particular logic level, such as a logic low level. At time t10, the boost voltage level of line $1090_0$ might be increased to the boost voltage level Boost_H_0, the boost voltage level of line $1090_1$ might be increased to the boost voltage level Boost_H_1, and the boost voltage level of line $1090_{2\text{-}3}$ might be increased to the boost voltage level Boost_H_2=Boost_L_3. The latches 664 of the sense circuits might be reset to a default logic level, which might be different than the particular logic level, such as a logic high level.

Between times t11 and t12, sensing (e.g., a second sensing) can be enabled, or strobed, and based on the values of the outputs 662 of the sense circuits, a respective second count can be made of a number of sense circuits of the buffer portions $840_0$, $840_1$ and $840_2$, and a respective first count can be made of a number of sense circuits of the buffer portion $840_3$, indicating the particular logic level. At time t13, the boost voltage level of line $1090_{2\text{-}3}$ might be increased to the boost voltage level Boost_H_3. The latches 664 of the sense circuits might be reset to the default logic level.

Between times t14 and t15, sensing (e.g., a third sensing) can be enabled, or strobed, and based on the values of the outputs 662 of the sense circuits, a respective second count can be made of a number of sense circuits of the buffer portion $840_3$ indicating the particular logic level. A respective value of a CFByte 884 for each of the buffer portions 840 might be equal to an absolute value of a difference between the respective first count and the respective second count for each of the buffer portions 840. The latches 664 of the sense circuits might be reset to the default logic level.

Between times t15 and t16, a determination might be made, responsive to the determined CFBytes 884, of a desired, e.g., calibrated, value of the boost voltage level, e.g., Boost_ref, that might be deemed to mitigate a number of bit errors of the sense operation. At time t16, the boost voltage level of lines $1090_0$, $1090_1$ and $1090_{2\text{-}3}$ might each be transitioned to the boost voltage level Boost_ref, which might have a value different than, or the same as, Boost_L_0, Boost_H_0, Boost_L_1, Boost_H_1, Boost_L_2, Boost_H_2, Boost_L_3 or Boost_H_3. As such, a line 1090 may transition higher, transition lower or remain at its previously applied boost voltage level. As used herein, a line 1090 remaining at its previously applied boost voltage level will be deemed to have transitioned to the boost voltage level Boost_ref, but having a magnitude of 0V.

Between times t17 and t18, sensing (e.g., a fourth or final sensing) can be enabled, or strobed, and based on the values of the outputs 662 of the sense circuits, a determination might be made as to the data states of the target memory cells corresponding to the sense circuits of the buffer portions 840.

With respect to FIG. 10C, line $1090_{0\text{-}1}$ might represent a boost voltage level capacitively coupled to one or more sense nodes 640 of sense circuits of the buffer portions $840_0$ and $840_1$, and line $1090_{2\text{-}3}$ might represent a boost voltage level capacitively coupled to one or more sense nodes 640 of the buffer portions $840_2$ and $840_3$. Line 1092 might represent the voltage level of the control signal senb provided to the signal lines 656 corresponding to each of these sense nodes 640.

At time t8, the boost voltage level of line $1090_{0\text{-}1}$ might represent the boost voltage level Boost_L_0, and the boost voltage level of line $1090_{2\text{-}3}$ might represent the boost voltage level Boost_L_2.

Between times t8 and t9, sensing (e.g., a first sensing) can be enabled, or strobed, and based on the values of the outputs 662 of the sense circuits, a respective first count can be made of a number of sense circuits of the buffer portions $840_0$ and $840_2$ indicating a particular logic level, such as a logic low level. At time t10, the boost voltage level of line $1090_{0\text{-}1}$ might be increased to the boost voltage level Boost_H_0=Boost_L_1, and the boost voltage level of line $1090_{2\text{-}3}$ might be increased to the boost voltage level Boost_H_2=Boost_L_3. The latches 664 of the sense circuits might be reset to a default logic level, which might be different than the particular logic level, such as a logic high level.

Between times t11 and t12, sensing (e.g., a second sensing) can be enabled, or strobed, and based on the values of the outputs 662 of the sense circuits, a respective second count can be made of a number of sense circuits of the buffer portions $840_0$ and $840_2$, and a respective first count can be made of a number of sense circuits of the buffer portions $840_1$ and $840_3$, indicating the particular logic level. At time t13, the boost voltage level of line $1090_{0\text{-}1}$ might be increased to the boost voltage level Boost_H_1 and the boost voltage level of line $1090_{2\text{-}3}$ might be increased to the boost voltage level Boost_H_3. The latches 664 of the sense circuits might be reset to the default logic level.

Between times t14 and t15, sensing (e.g., a third sensing) can be enabled, or strobed, and based on the values of the outputs 662 of the sense circuits, a respective second count can be made of a number of sense circuits of the buffer portions $840_1$ and $840_3$ indicating the particular logic level. A respective value of a CFByte 884 for each of the buffer portions 840 might be equal to an absolute value of a difference between the respective first count and the respective second count for each of the buffer portions 840. The latches 664 of the sense circuits might be reset to the default logic level.

Between times t15 and t16, a determination might be made, responsive to the determined CFBytes 884, of a desired, e.g., calibrated, value of the boost voltage level, e.g., Boost_ref, that might be deemed to mitigate a number of bit errors of the sense operation. At time t16, the boost voltage level of lines $1090_{0-1}$ and $1090_{2-3}$ might each be transitioned to the boost voltage level Boost_ref, which might have a value different than, or the same as, Boost_L_0, Boost_H_0, Boost_L_1, Boost_H_1, Boost_L_2, Boost_H_2, Boost_L_3 or Boost_H_3. As such, a line 1090 may transition higher, transition lower or remain at its previously applied boost voltage level. As used herein, a line 1090 remaining at its previously applied boost voltage level will be deemed to have transitioned to the boost voltage level Boost_ref, but having a magnitude of 0V.

Between times t17 and t18, sensing (e.g., a fourth or final sensing) can be enabled, or strobed, and based on the values of the outputs 662 of the sense circuits, a determination might be made as to the data states of the target memory cells corresponding to the sense circuits of the buffer portions 840.

The embodiments of FIGS. 10A-10C utilized count values of a number of sense circuits of the buffer portions 840 indicating a particular logic level. The sense circuits for a buffer portion 840 might include each sense circuit of that buffer portion 840, or some subset of sense circuits of that buffer portion 840. For some embodiments, a count value of a number of sense circuits of a buffer portion 840 indicating a particular logic level might be deemed to be derived from a logical function (e.g., ORing) of the logic levels of subsets of the sense circuits of that buffer portion 840.

A sensing operation, such as described with reference to FIG. 7 and any of FIGS. 10A-10C, might be performed for a number of data states to which the target memory cells of the sensing operation might have been programmed. For example, where the memory is configured to program memory cells to one of sixteen possible data states L0-L15, a respective sensing operation might be performed for each data state, e.g., L0-L14, other than a highest data state, e.g., L15, with each sensing operation applying a particular sense voltage level, corresponding to the data state being sensed, to the access line connected to the control gates of its target memory cells. Where sensing operations are performed from a lowest sense voltage level (e.g., corresponding to the data state L0) to a highest sense voltage level (e.g., corresponding to the data state L14), memory cells that first activate in response to the sense voltage level corresponding to a particular data state might be deemed to have that particular data state. Memory cells not activating in response to any of the corresponding sense voltage levels might be deemed to have the highest data state, e.g., L15.

It is noted that the multiple sense strobes used to determine a desired boost voltage level for a particular data state being sensed, and the determination of that desired boost voltage level, might be performed in the background, and thus may be unnoticed by an end user of the memory device. In particular, this process might be performed while an access line connected to control gates of the target memory cells of a sensing operation is being transitioned to the next (e.g., higher) sense voltage level.

Figure 11:
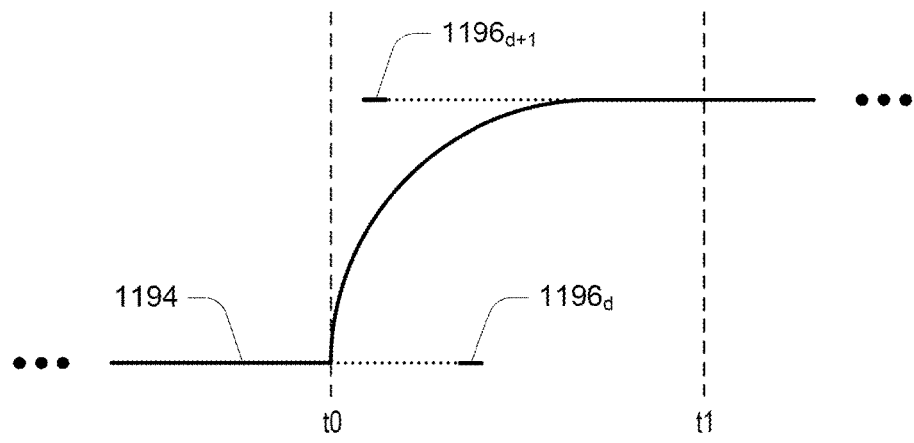
FIG. 11 is a timing diagram generally depicting voltage levels of an access line at various stages of multiple sense operations in accordance with an embodiment.

FIG. 11 is a timing diagram generally depicting voltage levels of an access line 202 at various stages of multiple sense operations, e.g., one sense operation for one data state and a subsequent sense operation for a higher data state, in accordance with an embodiment. In FIG. 11, line 1194 might represent the voltage level applied to a selected access line connected to control gates of target memory cells of each sensing operation. For example, the selected access line might be an access line 202 of the NAND string 206 of FIG. 6 connected to the memory cell of the NAND string 206 whose selective activation determines whether the sense node 640 experiences a discharge during a sensing operation. Access lines, e.g., unselected access lines, connected to control gates of remaining memory cells of that NAND string 206 might have a voltage level (or voltage levels) sufficient to activate those memory cells regardless of their data states.

With regard to FIG. 11, the line 1194 might have the voltage level $1196_d$ prior to time t0. Time t0 of FIG. 11 might correspond to time t4 or later of FIG. 7 for a particular sense operation, for example. The voltage level $1196_d$ might correspond to the sense voltage corresponding to the data state corresponding to the threshold voltage distribution $530_d$ of FIGS. 5A-5B, for example. At time t0, the voltage level of line 1194 might be increased, reaching the voltage level $1196_{d+1}$ at time t1. The voltage level $1196_{d+1}$ might correspond to the sense voltage corresponding to the data state corresponding to the threshold voltage distribution $530_{d+1}$ of FIGS. 5A-5B, for example. For some embodiments, at least a portion of the process depicted in FIGS. 10A-10C might occur within the period of time between time t0 and t1 of FIG. 11. For example, time t1 of FIG. 11 might occur later than time t15 of FIG. 10A for a sensing operation using a sense voltage level having the voltage level $1196_d$.

Figure 12:
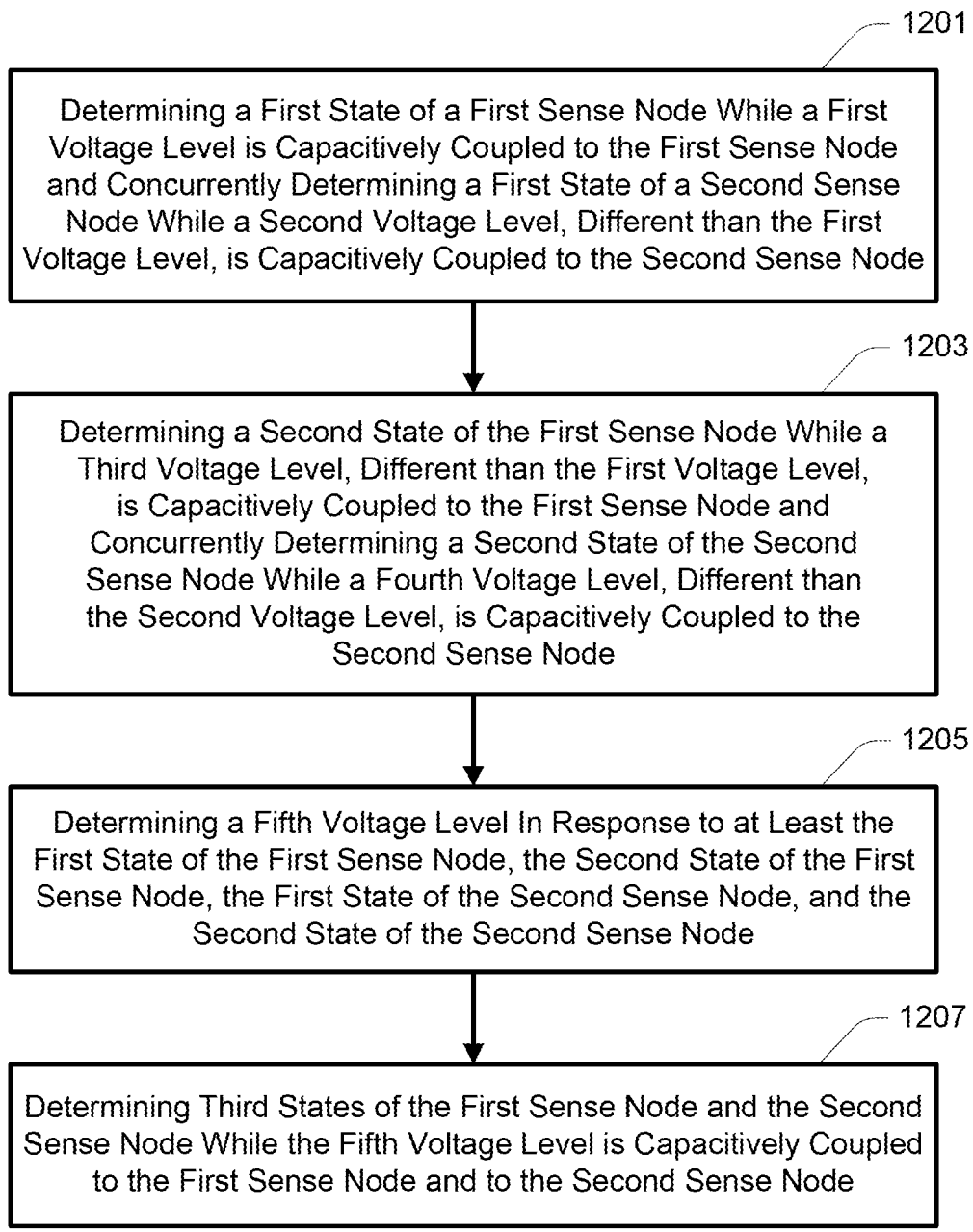
FIG. 12 is a flowchart of a method of operating a memory in accordance with an embodiment.

FIG. 12 is a flowchart of a method of operating a memory in accordance with an embodiment. At 1201, a first state of a first sense node might be determined while a first voltage level is capacitively coupled to the first sense node and, concurrently, a first state of a second sense node might be determined while a second voltage level, different than the first voltage level, is capacitively coupled to the second sense node. For example, the first sense node might correspond to a sense node 640 of a sense circuit 600 of a buffer portion $840_0$, and the second sense node might correspond to a sense node 640 of a sense circuit 600 of a buffer portion $840_1$. In this example, the first voltage level might correspond to the boost voltage level Boost_L_0, and the second voltage level might correspond to the boost voltage level Boost_L_1.

At 1203, a second state of the first sense node might be determined while a third voltage level, different than the first voltage level, is capacitively coupled to the first sense node and, concurrently, a second state of the second sense node might be determined while a fourth voltage level, different than the second voltage level, is capacitively coupled to the second sense node. Continuing with the example, the third voltage level might correspond to the boost voltage level Boost_H_0, and the fourth voltage level might correspond to the boost voltage level Boost_H_1.

At 1205, a fifth voltage level might be determined in response to at least the first state of the first sense node, the second state of the first sense node, the first state of the second sense node, and the second state of the second sense node. Continuing with the example, the fifth voltage level might correspond to the desired boost voltage level Boost_ref. At 1207, third states of the first sense node and the second sense node might be determined while the fifth voltage level is capacitively coupled to the first sense node and to the second sense node. Continuing with the example, the third states might correspond to the expected data states of the corresponding memory cells of the first and second sense nodes.

Figure 13A:
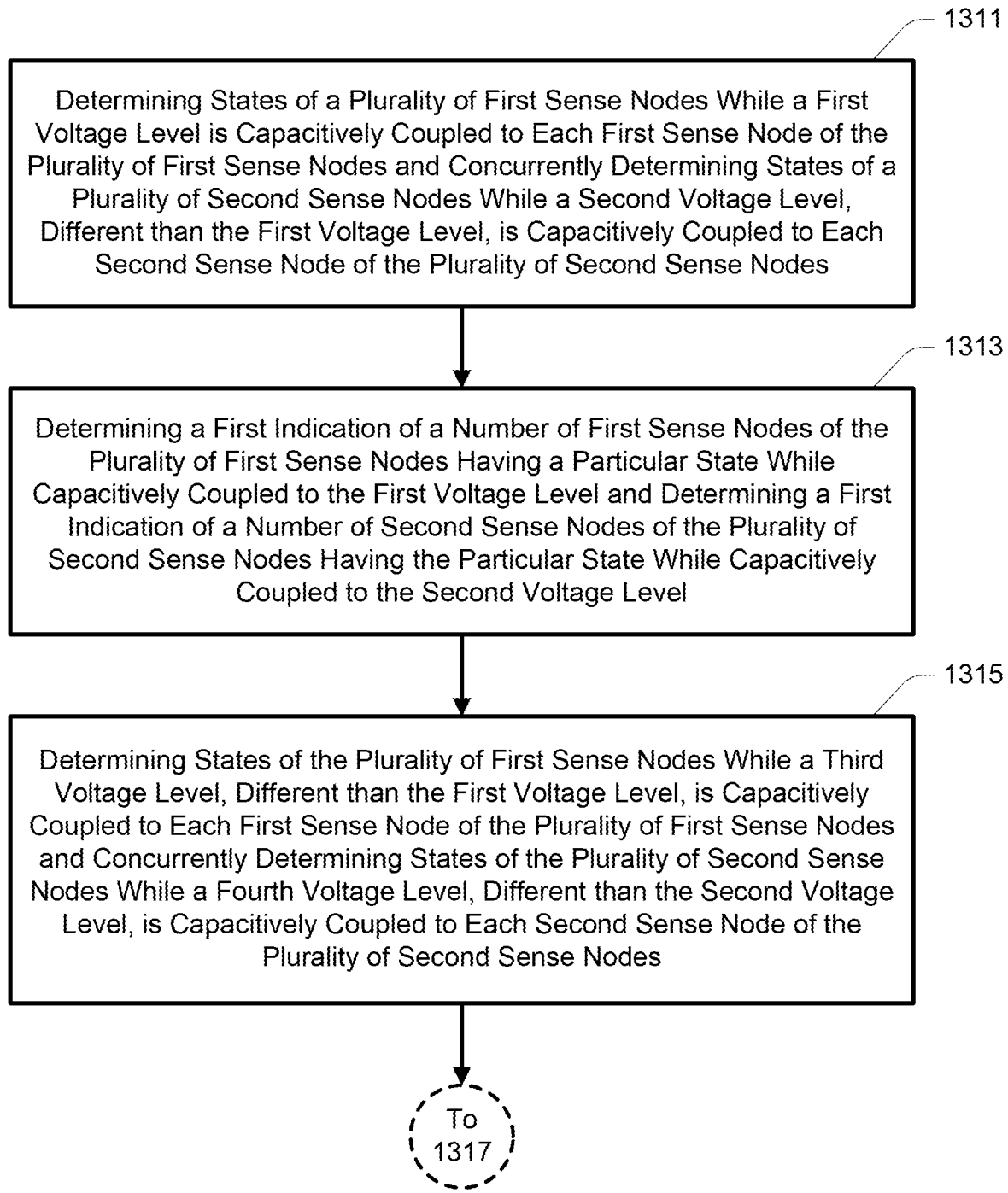
FIGS. 13A-13B are a flowchart of a method of operating a memory in accordance with another embodiment.
Figure 13B:
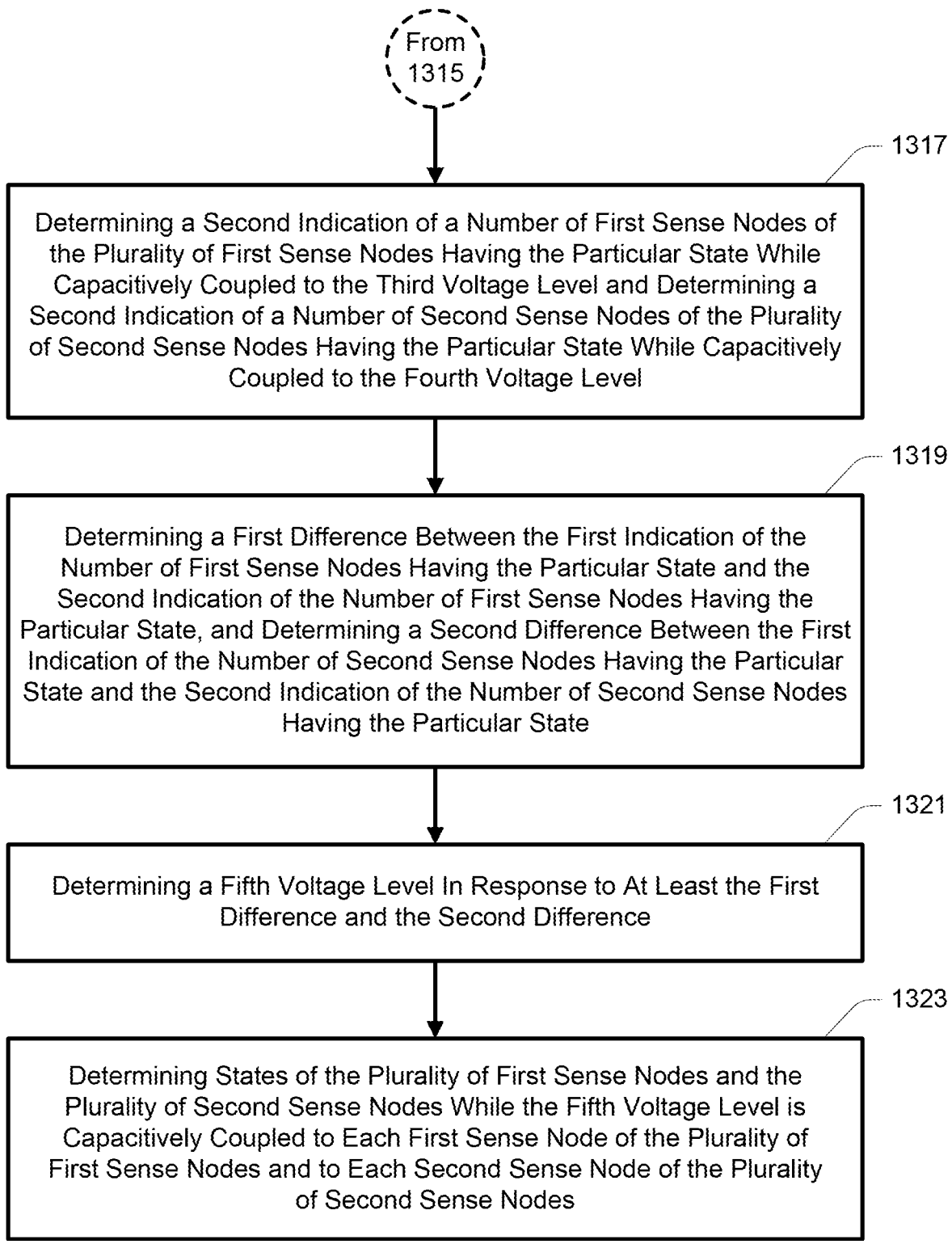

FIGS. 13A-13B are a flowchart of a method of operating a memory in accordance with another embodiment. At 1311, states of a plurality of first sense nodes might be determined while a first voltage level is capacitively coupled to each first sense node of the plurality of first sense nodes and, concurrently, states of a plurality of second sense nodes might be determined while a second voltage level, different than the first voltage level, is capacitively coupled to each second sense node of the plurality of second sense nodes. For example, the plurality of first sense nodes might correspond to the sense nodes 640 of a number of (e.g., all) sense circuits 600 of a buffer portion 840$_0$, and the plurality of second sense nodes might correspond to the sense nodes 640 of a number of (e.g., all) sense circuits 600 of a buffer portion 840$_1$. In this example, the first voltage level might correspond to the boost voltage level Boost_L_0, and the second voltage level might correspond to the boost voltage level Boost_L_1.

At 1313, a first indication of a number of first sense nodes of the plurality of first sense nodes having a particular state while capacitively coupled to the first voltage level might be determined and a first indication of a number of second sense nodes of the plurality of second sense nodes having the particular state while capacitively coupled to the second voltage level might be determined. The first indications of the numbers of sense nodes of the plurality of first or second sense nodes having the particular state might correspond to a count of their corresponding sense circuits having a particular logic level, a count of some subset of the corresponding sense circuits having the particular logic level, a logical function of outputs of the corresponding sense circuits having the particular logic level, etc.

At 1315, states of the plurality of first sense nodes might be determined while a third voltage level, different than the first voltage level, is capacitively coupled to each first sense node of the plurality of first sense nodes and, concurrently, states of the plurality of second sense nodes might be determined while a fourth voltage level, different than the second voltage level, is capacitively coupled to each second sense node of the plurality of second sense nodes. Continuing with the example, the third voltage level might correspond to the boost voltage level Boost_H_0, and the fourth voltage level might correspond to the boost voltage level Boost_H_1.

At 1317, a second indication of a number of first sense nodes of the plurality of first sense nodes having the particular state while capacitively coupled to the third voltage level might be determined and a second indication of a number of second sense nodes of the plurality of second sense nodes having the particular state while capacitively coupled to the fourth voltage level might be determined. The second indications of the numbers of sense nodes of the plurality of first or second sense nodes having the particular state might correspond to a count of their corresponding sense circuits having the particular logic level, a count of some subset of the corresponding sense circuits having the particular logic level, a logical function of outputs of the corresponding sense circuits having the particular logic level, etc.

At 1319, a first difference between the first indication of the number of first sense nodes having the particular state and the second indication of the number of first sense nodes having the particular state might be determined, and a second difference between the first indication of the number of second sense nodes having the particular state and the second indication of the number of second sense nodes having the particular state might be determined. The first difference might correspond to CFByte 884$_0$, and the second difference might correspond to CFByte 884$_1$, for example.

At 1321, a fifth voltage level might be determined in response to at least the first difference and the second difference. For example, a local minima might be determined in response to histograms of the differences as function of voltage levels. At 1323, states of the plurality of first sense nodes and the plurality of second sense nodes might be determined while the fifth voltage level is capacitively coupled to each first sense node of the plurality of first sense nodes and to each second sense node of the plurality of second sense nodes. Continuing with the example, the states determined while the fifth voltage level is capacitively coupled to each of the sense nodes might correspond to the expected data states of the corresponding memory cells of these sense nodes.

Figure 14:
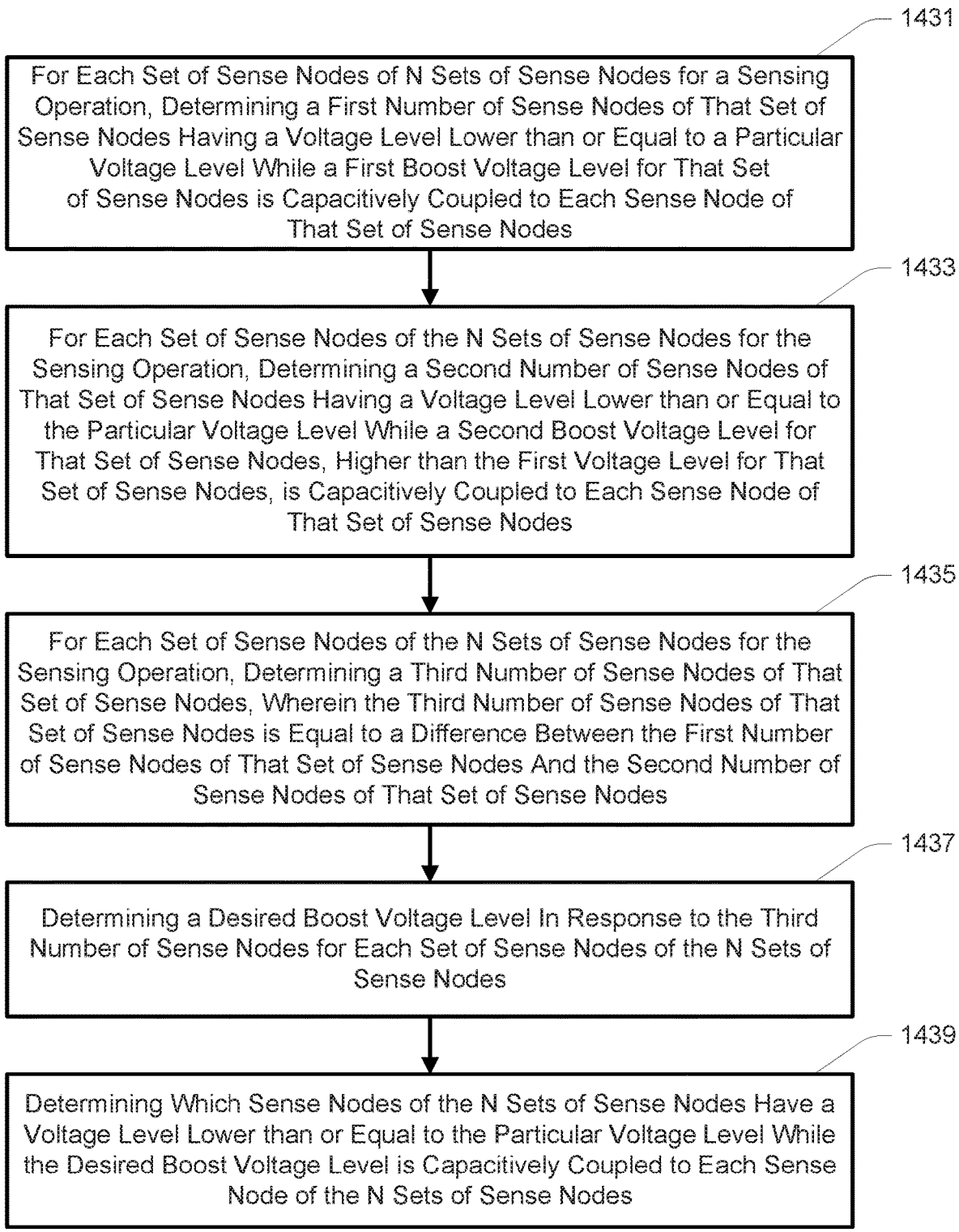
FIG. 14 is a flowchart of a method of operating a memory in accordance with a further embodiment.

FIG. 14 is a flowchart of a method of operating a memory in accordance with a further embodiment. At 1431, for each set of sense nodes of N sets of sense nodes for a sensing operation, a first number of sense nodes of that set of sense nodes having a voltage level lower than or equal to a particular voltage level while a first boost voltage level for that set of sense nodes is capacitively coupled to each sense node of that set of sense nodes might be determined. For example, N might be four, where each set of sense nodes corresponds to a number of (e.g., all) sense nodes 640 of the sense circuits 600 corresponding to a particular buffer portion 840 of the buffer portions 840$_0$-840$_3$ of the page buffer 852. In this example, the first boost voltage levels for the N sets of sense nodes might correspond to the boost voltage levels Boost_L_0, Boost_L_1, Boost_L_2, and Boost_L_3, respectively. The particular voltage level for a set of sense nodes might correspond to a voltage level sufficient to change an output logic level of the sense circuits for that set of sense nodes, e.g., a voltage level corresponding to a threshold voltage of the transistor 650, for example.

At 1433, for each set of sense nodes of the N sets of sense nodes for the sensing operation, a second number of sense nodes of that set of sense nodes having a voltage level lower than or equal to the particular voltage level while a second boost voltage level for that set of sense nodes, higher than the first voltage level for that set of sense nodes, is capacitively coupled to each sense node of that set of sense nodes might be determined. In this example, the second boost voltage levels for the N sets of sense nodes might correspond to the boost voltage levels Boost_H_0, Boost_H_1, Boost_H_2, and Boost_H_3, respectively.

At 1435, for each set of sense nodes of the N sets of sense nodes for the sensing operation, a third number of sense nodes of that set of sense nodes might be determined, wherein the third number of sense nodes of that set of sense nodes is equal to a difference between the first number of sense nodes of that set of sense nodes and the second number of sense nodes of that set of sense nodes. Continuing with the example, the third number of sense nodes for a set of sense nodes might correspond to the CFByte 884 of its corresponding buffer portion 840.

At 1437, a desired boost voltage level, e.g., the boost voltage level Boost_ref, might be determined in response to the third number of sense nodes for each set of sense nodes of the n sets of sense nodes. For example, a local minima might be determined in response to histograms of the third numbers as function of voltage levels. At 1439, which sense nodes of the N sets of sense nodes have a voltage level lower than or equal to the particular voltage level while the desired boost voltage level is capacitively coupled to each sense node of the n sets of sense nodes might be determined. Sense nodes of the N sets of sense nodes having voltage levels lower than or equal to the particular voltage level might be determined to have a data state at or below a particular data state corresponding to a sense voltage applied to a selected access line during the sense operation, while sense nodes of the N sets of sense nodes having voltage levels lower than the particular voltage level might be determined to have a data state above the particular data state.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
    determining a first state of a first sense node while a first voltage level is capacitively coupled to the first sense node and concurrently determining a first state of a second sense node while a second voltage level, different than the first voltage level, is capacitively coupled to the second sense node;
    determining a second state of the first sense node while a third voltage level, different than the first voltage level, is capacitively coupled to the first sense node and concurrently determining a second state of the second sense node while a fourth voltage level, different than the second voltage level, is capacitively coupled to the second sense node;
    determining a fifth voltage level in response to at least the first state of the first sense node, the second state of the first sense node, the first state of the second sense node, and the second state of the second sense node; and
    determining third states of the first sense node and the second sense node while the fifth voltage level is capacitively coupled to the first sense node and to the second sense node.

2. The method of claim 1, wherein determining the second state of the first sense node while the third voltage level, different than the first voltage level, is capacitively coupled to the first sense node comprises determining the second state of the first sense node while the third voltage level, higher than the first voltage level, is capacitively coupled to the first sense node.

3. The method of claim 2, wherein determining the second state of the second sense node while the fourth voltage level, different than the second voltage level, is capacitively coupled to the second sense node comprises determining the second state of the second sense node while the fourth voltage level, higher than the second voltage level, is capacitively coupled to the second sense node.

4. The method of claim 1, wherein determining the second state of the first sense node while the third voltage level, different than the first voltage level, is capacitively coupled to the first sense node comprises determining the second state of the first sense node while the third voltage level, equal to the second voltage level, is capacitively coupled to the first sense node.

5. The method of claim 1, further comprising:
    concurrently with determining the first state of the first sense node and determining the first state of the second sense node, determining a first state of a third sense node while a sixth voltage level, different than the first voltage level and different than the second voltage level, is capacitively coupled to the third sense node;
    concurrently with determining the second state of the first sense node and determining the second state of the second sense node, determining a second state of the third sense node while a seventh voltage level, different than the sixth voltage level, different than the third voltage level and different than the fourth voltage level, is capacitively coupled to the third sense node;
    determining the fifth voltage level in response to at least the first state of the first sense node, the second state of the first sense node, the first state of the second sense node, the second state of the second sense node, the first state of the third sense node, and the second state of the third sense node; and
    determining a third state of the third sense node, concurrently with determining the third states of the first sense node and the second sense node, while the fifth voltage level is capacitively coupled to the first sense node, to the second sense node and to the third sense node.

6. The method of claim 5, further comprising:
    wherein determining the second state of the first sense node while the third voltage level, different than the first voltage level, is capacitively coupled to the first sense node comprises determining the second state of the first sense node while the third voltage level, equal to the second voltage level, is capacitively coupled to the first sense node; and
    wherein determining the second state of the second sense node while the fourth voltage level, different than the second voltage level, is capacitively coupled to the second sense node comprises determining the second state of the second sense node while the fourth voltage level, equal to the sixth voltage level, is capacitively coupled to the second sense node.

7. The method of claim 6, wherein determining the second state of the third sense node while the seventh voltage level, different than the sixth voltage level, is capacitively coupled to the third sense node comprises determining the second state of the third sense node while the seventh voltage level, higher than the sixth voltage level, is capacitively coupled to the third sense node.

8. The method of claim 1, wherein the first sense node is a particular sense node of a first plurality of sense nodes and the second sense node is a particular sense node of a second plurality of sense nodes mutually exclusive of the first plurality of sense nodes, the method further comprising:
    determining a respective first state of each sense node of the first plurality of sense nodes while the first voltage level is capacitively coupled to each sense node of the first plurality of sense nodes and concurrently determining a respective first state of each sense node of the second plurality of sense nodes while the second voltage level is capacitively coupled to each sense node of the second plurality of sense nodes;
    determining a respective second state of each sense node of the first plurality of sense nodes while the third voltage level is capacitively coupled to each sense node of the first plurality of sense nodes and concurrently determining a respective second state of each sense node of the second plurality of sense nodes while the fourth voltage level is capacitively coupled to each sense node of the second plurality of sense nodes;

determining the fifth voltage level in response to at least an indication of a number of sense nodes of the first plurality of sense nodes changing states between their respective first state and their respective second state, and an indication of a number of sense nodes of the second plurality of sense nodes changing states between their respective first state and their respective second state.

9. A method of operating a memory, comprising:

determining states of a plurality of first sense nodes while a first voltage level is capacitively coupled to each first sense node of the plurality of first sense nodes and concurrently determining states of a plurality of second sense nodes while a second voltage level, different than the first voltage level, is capacitively coupled to each second sense node of the plurality of second sense nodes;

determining a first indication of a number of first sense nodes of the plurality of first sense nodes having a particular state while capacitively coupled to the first voltage level and determining a first indication of a number of second sense nodes of the plurality of second sense nodes having the particular state while capacitively coupled to the second voltage level;

determining states of the plurality of first sense nodes while a third voltage level, different than the first voltage level, is capacitively coupled to each first sense node of the plurality of first sense nodes and concurrently determining states of the plurality of second sense nodes while a fourth voltage level, different than the second voltage level, is capacitively coupled to each second sense node of the plurality of second sense nodes;

determining a second indication of a number of first sense nodes of the plurality of first sense nodes having the particular state while capacitively coupled to the third voltage level and determining a second indication of a number of second sense nodes of the plurality of second sense nodes having the particular state while capacitively coupled to the fourth voltage level;

determining a first difference between the first indication of the number of first sense nodes having the particular state and the second indication of the number of first sense nodes having the particular state, and determining a second difference between the first indication of the number of second sense nodes having the particular state and the second indication of the number of second sense nodes having the particular state;

determining a fifth voltage level in response to at least the first difference and the second difference; and determining states of the plurality of first sense nodes and the plurality of second sense nodes while the fifth voltage level is capacitively coupled to each first sense node of the plurality of first sense nodes and to each second sense node of the plurality of second sense nodes.

10. The method of claim 9, wherein determining the first indication of the number of first sense nodes of the plurality of first sense nodes having the particular state while capacitively coupled to the first voltage level and determining the first indication of the number of second sense nodes of the plurality of second sense nodes having the particular state while capacitively coupled to the second voltage level comprises determining a number of first sense nodes of the plurality of first sense nodes deemed to have a voltage level lower than or equal to a particular voltage level while capacitively coupled to the first voltage level and determining a number of second sense nodes of the plurality of second sense nodes deemed to have a voltage level lower than or equal to the particular voltage level while capacitively coupled to the second voltage level.

11. The method of claim 10, wherein determining the second indication of the number of first sense nodes of the plurality of first sense nodes having the particular state while capacitively coupled to the third voltage level and determining the second indication of the number of second sense nodes of the plurality of second sense nodes having the particular state while capacitively coupled to the fourth voltage level comprises determining a number of first sense nodes of the plurality of first sense nodes deemed to have a voltage level lower than or equal to the particular voltage level while capacitively coupled to the third voltage level and determining a number of second sense nodes of the plurality of second sense nodes deemed to have a voltage level lower than or equal to the particular voltage level while capacitively coupled to the fourth voltage level.

12. The method of claim 9, wherein determining the first indication of the number of first sense nodes of the plurality of first sense nodes having the particular state while capacitively coupled to the first voltage level and determining the first indication of the number of second sense nodes of the plurality of second sense nodes having the particular state while capacitively coupled to the second voltage level comprises determining a number of first sense nodes of a subset of the plurality of first sense nodes deemed to have a voltage level lower than or equal to a particular voltage level while capacitively coupled to the first voltage level and determining a number of second sense nodes of a subset of the plurality of second sense nodes deemed to have a voltage level lower than or equal to the particular voltage level while capacitively coupled to the second voltage level.

13. The method of claim 12, wherein determining the second indication of the number of first sense nodes of the plurality of first sense nodes having the particular state while capacitively coupled to the third voltage level and determining the second indication of the number of second sense nodes of the plurality of second sense nodes having the particular state while capacitively coupled to the fourth voltage level comprises determining a number of first sense nodes of the subset of the plurality of first sense nodes deemed to have a voltage level lower than or equal to a particular voltage level while capacitively coupled to the third voltage level and determining a number of second sense nodes of the subset of the plurality of second sense nodes deemed to have a voltage level lower than or equal to the particular voltage level while capacitively coupled to the fourth voltage level.

14. The method of claim 9, wherein determining the first indication of the number of first sense nodes of the plurality of first sense nodes having the particular state while capacitively coupled to the first voltage level and determining the first indication of the number of second sense nodes of the plurality of second sense nodes having the particular state while capacitively coupled to the second voltage level comprises determining a result of a logical function of states of the first sense nodes of the plurality of first sense nodes while capacitively coupled to the first voltage level and determining a result of the logical function of states of the second sense nodes of the plurality of second sense nodes while capacitively coupled to the second voltage level.

15. A method of operating a memory, comprising:
determining states of a plurality of first sense nodes while a first voltage level is capacitively coupled to each first sense node of the plurality of first sense nodes and concurrently determining states of a plurality of second sense nodes while a second voltage level, higher than the first voltage level, is capacitively coupled to each second sense node of the plurality of second sense nodes;
determining a first number of first sense nodes of the plurality of first sense nodes having a particular state while capacitively coupled to the first voltage level and determining a first number of second sense nodes of the plurality of second sense nodes having the particular state while capacitively coupled to the second voltage level;
determining states of the plurality of first sense nodes while a third voltage level, higher than the first voltage level, is capacitively coupled to each first sense node of the plurality of first sense nodes and concurrently determining states of the plurality of second sense nodes while a fourth voltage level, higher than the second voltage level and higher than the third voltage level, is capacitively coupled to each second sense node of the plurality of second sense nodes;
determining a second number of first sense nodes of the plurality of first sense nodes having the particular state while capacitively coupled to the third voltage level and determining a second number of second sense nodes of the plurality of second sense nodes having the particular state while capacitively coupled to the fourth voltage level;
determining a first difference between the first number of first sense nodes having the particular state and the second number of first sense nodes having the particular state, and determining a second difference between the first number of second sense nodes having the particular state and the second number of second sense nodes having the particular state;
determining a fifth voltage level in response to at least the first difference and the second difference; and
determining states of the plurality of first sense nodes and the plurality of second sense nodes while the fifth voltage level is capacitively coupled to each first sense node of the plurality of first sense nodes and to each second sense node of the plurality of second sense nodes.

16. The method of claim 15, wherein determining the state of a particular first sense node of the plurality of first sense nodes while the first voltage level is capacitively coupled to the particular first sense node of the plurality of first sense nodes comprises determining whether a transistor having a control gate connected to the particular first sense node of the plurality of first sense nodes is activated.

17. The method of claim 16, wherein determining the state of a particular second sense node of the plurality of second sense nodes while the second voltage level is capacitively coupled to the particular second sense node of the plurality of second sense nodes comprises determining whether a transistor having a control gate connected to the particular second sense node of the plurality of second sense nodes is activated.

18. A method of operating a memory, comprising:
for each set of sense circuits of N sets of sense circuits for a sensing operation:
determining a first number of sense circuits of that set of sense circuits having a particular logic level while a first boost voltage level for that set of sense circuits is capacitively coupled to a respective sense node of each sense circuit of that set of sense circuits;
determining a second number of sense circuits of that set of sense circuits having the particular logic level while a second boost voltage level for that set of sense circuits, higher than the first boost voltage level for that set of sense circuits, is capacitively coupled to the respective sense node of each sense circuit of that set of sense circuits; and
determining a third number of sense circuits of that set of sense circuits, wherein the third number of sense circuits of that set of sense circuits is equal to a difference between the first number of sense circuits of that set of sense circuits and the second number of sense circuits of that set of sense circuits;
determining a desired boost voltage level in response to the third number of sense circuits for each set of sense circuits of the N sets of sense circuits; and
determining which sense circuits of the N sets of sense circuits have the particular logic level while the desired boost voltage level is capacitively coupled to the respective sense node of each sense circuit of the N sets of sense circuits;
wherein N is an integer greater than or equal to two;
wherein the first boost voltage level for an Xth set of sense circuits of the N sets of sense circuits is lower than the first boost voltage level for an (X+1)th set of sense circuits of the N sets of sense circuits for each integer value of X greater than or equal to 1 and less than N;
wherein the second boost voltage level for the Xth set of sense circuits of the N sets of sense circuits is lower than the second boost voltage level for the (X+1)th set of sense circuits of the N sets of sense circuits for each integer value of X greater than or equal to 1 and less than N.

19. The method of claim 18, wherein the second boost voltage level for the Xth set of sense circuits of the N sets of sense circuits is equal to the first boost voltage level for the (X+1)th set of sense circuits of the N sets of sense circuits for each integer value of X greater than or equal to 1 and less than N.

20. The method of claim 18, wherein determining the first number of sense circuits of that set of sense circuits having the particular logic level while the first boost voltage level for that set of sense circuits is capacitively coupled to the respective sense node of each sense circuit of that set of sense circuits comprises determining whether the respective sense node of a particular sense circuit of that set of sense circuits has a voltage level sufficient to activate a transistor having a control gate connected to that respective sense node.

21. The method of claim 18, wherein each sense circuit of the N sets of sense circuits corresponds to a respective data line of a plurality of data lines, and wherein each data line of the plurality of data lines corresponds to a respective memory cell of a plurality of memory cells commonly connected to a particular access line, the method further comprising:
prior to determining the first number of sense circuits of any set of sense circuits of the N sets of sense circuits having the particular logic level:
precharging each data line of the plurality of data lines and each sense node of each sense circuit of the N sets of sense circuits to a predetermined precharge voltage level, then isolating each sense node of each sense circuit of the N sets of sense circuits from its respective corresponding data line of the plurality of data lines;

for each data line of the plurality of data lines, selectively discharging that data line in response to whether its respective memory cell of the plurality of memory cells is activated in response to a particular sense voltage applied to the particular access line;

capacitively coupling a third boost voltage level to the respective sense node of each sense circuit of the N sets of sense circuits, wherein the third boost voltage level is higher than the respective second boost voltage level for each set of sense circuits of the N sets of sense circuits;

after capacitively coupling the third boost voltage level to the respective sense node of each sense circuit of the N sets of sense circuits, selectively discharging the respective sense node of each sense circuit of the N sets of sense circuits responsive to a voltage level of the respective data line of the plurality of data lines corresponding to that sense circuit of the N sets of sense circuits, then isolating the respective sense node of that sense circuit of the N sets of sense circuits from its respective data line.

22. An apparatus, comprising:

an array of memory cells comprising a plurality of strings of series-connected memory cells;

a plurality of access lines commonly connected to the plurality of strings of series-connected memory cells;

a plurality of data lines, wherein each data line of the plurality of data lines is selectively connected to a respective string of series-connected memory cells of the plurality of strings of series-connected memory cells and connected to a respective sense circuit of a plurality of sense circuits; and a controller configured to access the array of memory cells;

wherein the controller, during a sensing operation, is configured to:

determine a first state of a first sense node of a first sense circuit of the plurality of sense circuits while a first voltage level is capacitively coupled to the first sense node and concurrently determine a first state of a second sense node of a second sense circuit of the plurality of sense circuits while a second voltage level, different than the first voltage level, is capacitively coupled to the second sense node;

determine a second state of the first sense node while a third voltage level, different than the first voltage level, is capacitively coupled to the first sense node and concurrently determine a second state of the second sense node while a fourth voltage level, different than the second voltage level, is capacitively coupled to the second sense node;

determine a fifth voltage level in response to at least the first state of the first sense node, the second state of the first sense node, the first state of the second sense node, and the second state of the second sense node; and determine third states of the first sense node and the second sense node while the fifth voltage level is capacitively coupled to the first sense node and to the second sense node.

* * * * *